(12) United States Patent
Kakehata et al.

(10) Patent No.: US 11,362,034 B2
(45) Date of Patent: Jun. 14, 2022

(54) SEMICONDUCTOR DEVICE HAVING A LAMINATE CONTACT PLUG OF SPECIFIED CONFIGURATION INCLUDING A CONDUCTIVE METAL OXIDE LAYER

(71) Applicant: Semiconductor Energy Laboratory Co., Ltd., Atsugi (JP)

(72) Inventors: Tetsuya Kakehata, Isehara (JP); Yuta Endo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 36 days.

(21) Appl. No.: 16/979,244

(22) PCT Filed: Mar. 28, 2019

(86) PCT No.: PCT/IB2019/052519
§ 371 (c)(1),
(2) Date: Sep. 9, 2020

(87) PCT Pub. No.: WO2019/193463
PCT Pub. Date: Oct. 10, 2019

(65) Prior Publication Data
US 2020/0402910 A1    Dec. 24, 2020

(30) Foreign Application Priority Data

Apr. 4, 2018   (JP) .............................. JP2018-072258

(51) Int. Cl.
*H01L 23/532* (2006.01)
*H01L 21/768* (2006.01)

(52) U.S. Cl.
CPC .... *H01L 23/5329* (2013.01); *H01L 21/76844* (2013.01); *H01L 23/53257* (2013.01); *H01L 23/53271* (2013.01)

(58) Field of Classification Search
None
See application file for complete search history.

(56) References Cited

U.S. PATENT DOCUMENTS 6,184,584 B1 * 2/2001 Sakao ................. H01L 23/5226
                                                          257/758
10,096,718 B2   10/2018 Asami
(Continued)

FOREIGN PATENT DOCUMENTS

CN    109478514 A   3/2019
JP    2009-054879 A  3/2009
(Continued)

OTHER PUBLICATIONS

International Search Report (Application No. PCT/IB2019/052519) dated Jul. 9, 2019.
(Continued)

*Primary Examiner* — Erik Kielin
(74) *Attorney, Agent, or Firm* — Robinson Intellectual Property Law Office; Eric J. Robinson

(57) ABSTRACT

A semiconductor device that is miniaturized and highly integrated is provided. One embodiment of the present invention is a semiconductor device including a first insulator, a second insulator, a first conductor, a second conductor, and a semiconductor layer; the first insulator includes an opening exposing the semiconductor layer; the first conductor is provided in contact with the semiconductor layer at a bottom of the opening; the second insulator is provided in contact with a top surface of the first conductor and a side surface in the opening; the second conductor is provided in contact with the top surface of the first conductor and in the opening with the second insulator therebetween; and the second insulator has a barrier property against oxygen.

13 Claims, 16 Drawing Sheets

(56) References Cited

U.S. PATENT DOCUMENTS

| | | |
|---|---|---|
| 10,236,390 B2 | 3/2019 | Yamane et al. |
| 2014/0138607 A1* | 5/2014 | Ito .................. H01L 45/1266 |
| | | 257/4 |
| 2015/0054160 A1* | 2/2015 | Liu .................. H01L 21/76844 |
| | | 257/762 |
| 2015/0118837 A1* | 4/2015 | Shieh ............... H01L 21/76846 |
| | | 438/586 |
| 2017/0365720 A1 | 12/2017 | Asami |
| 2018/0033892 A1 | 2/2018 | Yamane et al. |
| 2020/0203533 A1 | 6/2020 | Yamazaki et al. |

FOREIGN PATENT DOCUMENTS

| | | |
|---|---|---|
| JP | 2017-228777 A | 12/2017 |
| JP | 2018-133550 A | 8/2018 |
| KR | 2019-0032414 A | 3/2019 |
| TW | 201816988 | 5/2018 |
| WO | WO-2018/020350 | 2/2018 |

OTHER PUBLICATIONS

Written Opinion (Application No. PCT/IB2019/052519) dated Jul. 9, 2019.

* cited by examiner

FIG. 15A
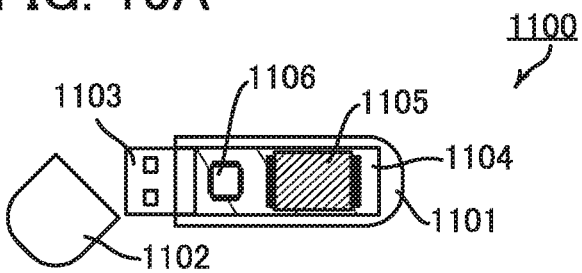
FIG. 15B  FIG. 15C
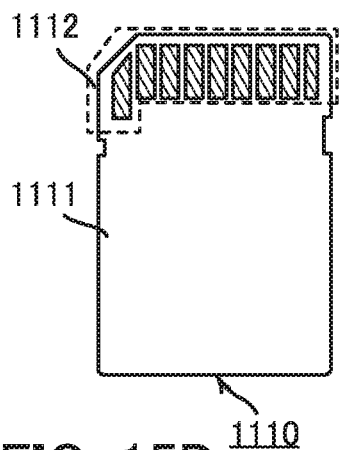 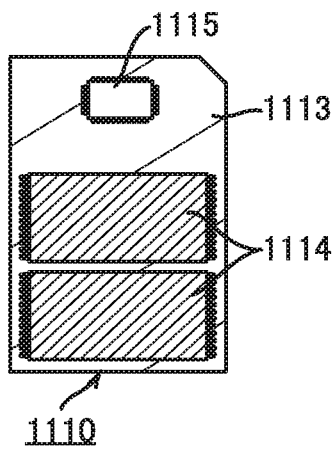
FIG. 15D  FIG. 15E
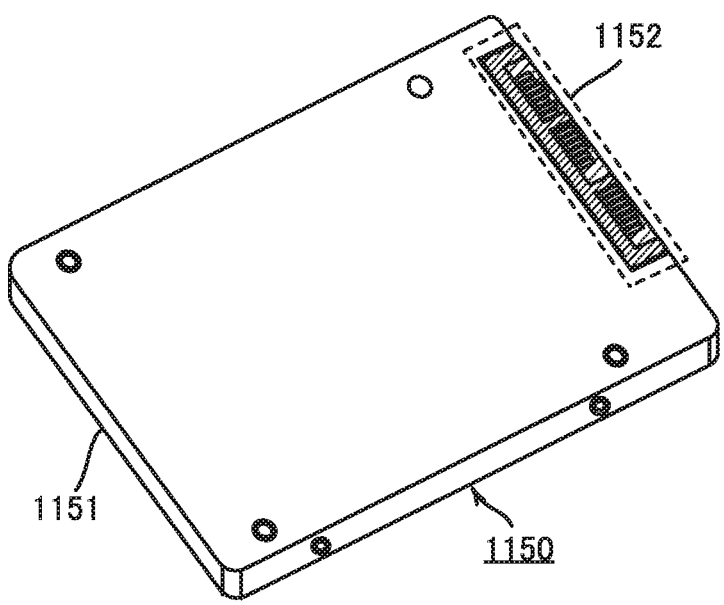 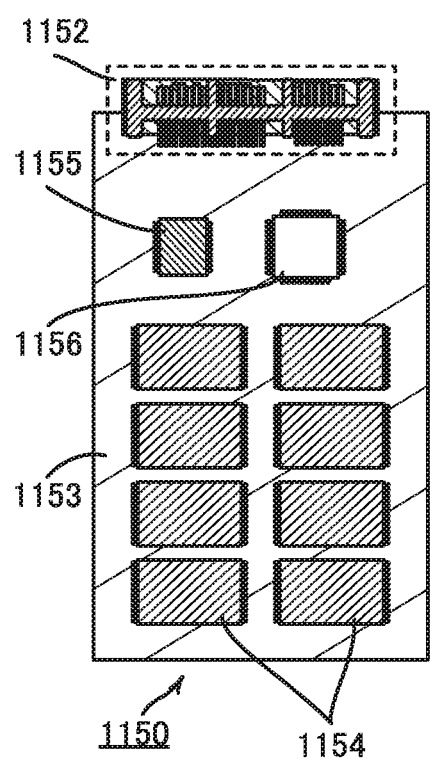

SEMICONDUCTOR DEVICE HAVING A LAMINATE CONTACT PLUG OF SPECIFIED CONFIGURATION INCLUDING A CONDUCTIVE METAL OXIDE LAYER

TECHNICAL FIELD

One embodiment of the present invention relates to a method for forming a plug and a wiring using a metal which are applied to a semiconductor device and a method for manufacturing the semiconductor device.

Note that in this specification and the like, a semiconductor device refers to a device that can function by utilizing semiconductor characteristics, in general. A semiconductor element such as a transistor, a semiconductor circuit, an arithmetic device, and a memory device are each one embodiment of a semiconductor device. It can be sometimes said that a display device (a liquid crystal display device, a light-emitting display device, or the like), a projection device, a lighting device, an electro-optical device, a power storage device, a memory device, a semiconductor circuit, an imaging device, an electronic device, or the like includes a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, or manufacture.

BACKGROUND ART

With the progress of integration degree of semiconductor devices, the proportion of a wiring portion tends to be increased in the semiconductor device and a multilayer wiring structure has been considered. In order to connect wiring layers in the multilayer wiring structure, a plug that is a conductor embedded in a via hole or a contact hole is formed.

For example, for connection in a multilayer wiring or between wiring layers in a semiconductor device, a method is employed in which an embedded plug structure using a conductor is formed by removing the conductor by a CMP technique.

Furthermore, in a semiconductor device, with the progress of integration, the dimensions of wirings, opening diameters of the contact holes, and the like have been required to be miniaturized. Thus, a favorable connection structure between wirings has been proposed (for example, see Patent Document 1) in order to prevent defective conduction between wirings that are even miniaturized. In Patent Document 1, unevenness caused in a formation region of a wiring is planarized by gas ion irradiation, so that coverage by the wiring is improved.

REFERENCE

Patent Document

[Patent Document 1] Japanese Published Patent Application No. 2009-54879

SUMMARY OF THE INVENTION

Problems to be Solved by the Invention

An object of one embodiment of the present invention is to prevent a defective conduction between semiconductor elements and wirings or between wirings of a miniaturized semiconductor device. An object of one embodiment of the present invention is to provide a semiconductor device that can be miniaturized or highly integrated. An object of one embodiment of the present invention is to provide a semiconductor device with high design flexibility.

An object of one embodiment of the present invention is to provide a semiconductor device which includes a transistor and in which the transistor has stable electrical characteristics and reliability. An object of one embodiment of the present invention is to provide a semiconductor device having favorable electrical characteristics. An object of one embodiment of the present invention is to provide a semiconductor device with high productivity.

An object of one embodiment of the present invention is to provide a semiconductor device capable of reducing power consumption. An object of one embodiment of the present invention is to provide a semiconductor device with high-speed data writing. An object of one embodiment of the present invention is to provide a semiconductor device capable of retaining data for a long time. An object of one embodiment of the present invention is to provide a novel semiconductor device.

Note that the descriptions of these objects do not disturb the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a semiconductor device including a first insulator, a second insulator, a first conductor, a second conductor, and a semiconductor layer; the first insulator includes an opening exposing the semiconductor layer; the first conductor is provided in contact with the semiconductor layer at a bottom of the opening; the second insulator is provided in contact with a top surface of the first conductor and a side surface in the opening; the second conductor is provided in contact with the top surface of the first conductor and in the opening with the second insulator therebetween; and the second insulator includes an oxide containing one kind or more kinds selected from hafnium, aluminum, boron, gallium, zinc, yttrium, zirconium, tungsten, titanium, tantalum, nickel, germanium, magnesium, and the like, or a nitride containing aluminum or silicon.

In the above, the semiconductor layer includes In, an element M (M is Al, Ga, Y, or Sn), and Zn.

One embodiment of the present invention is a semiconductor device including a first insulator, a second insulator, a first conductor, a second conductor, and a third conductor; the first insulator includes an opening exposing the third conductor; the first conductor is provided in contact with the third conductor at a bottom of the opening; the second insulator has a barrier property against oxygen, and is provided in contact with a top surface of the first conductor and a side surface in the opening; the second conductor is provided in contact with the top surface of the first conductor and in the opening with the second insulator therebetween; and the second insulator includes an oxide containing one kind or more kinds selected from hafnium, aluminum, boron, gallium, zinc, yttrium, zirconium, tungsten, titanium, tantalum, nickel, germanium, magnesium, and the like, or a nitride containing aluminum or silicon.

In the above, the first conductor is preferably hardly oxidizable.

In the above, the projected area of the first conductor is preferably larger than that of the second conductor.

In the above, it is preferable that the first insulator contain excess oxygen and the second insulator have a barrier property against oxygen.

Effect of the Invention

According to one embodiment of the present invention, a semiconductor device in which defective conduction between semiconductor elements and wirings or between wirings is inhibited can be provided. According to one embodiment of the present invention, a semiconductor device that can be miniaturized or highly integrated can be provided. According to one embodiment of the present invention, a semiconductor device with high design flexibility can be provided.

According to one embodiment of the present invention, a semiconductor device which includes a transistor and in which the transistor has stable electrical characteristics and reliability can be provided. According to one embodiment of the invention, a semiconductor device having favorable electrical characteristics can be provided. According to one embodiment of the present invention, a semiconductor device with high productivity can be provided.

According to one embodiment of the present invention, a semiconductor device with high-speed data writing can be provided. According to one embodiment of the present invention, a semiconductor device capable of retaining data for a long time can be provided. According to one embodiment of the present invention, a semiconductor device capable of reducing power consumption can be provided. According to one embodiment of the present invention, a novel semiconductor device can be provided.

Note that the descriptions of these effects do not disturb the existence of other effects. One embodiment of the present invention does not have to have all of these effects. Effects other than these will be apparent from the descriptions of the specification, the drawings, the claims, and the like, and effects other than these can be derived from the descriptions of the specification, the drawings, the claims, and the like.

BRIEF DESCRIPTION OF THE DRAWINGS

FIG. 15 (A) to (E) Schematic views of memory devices of embodiments of the present invention.

MODE FOR CARRYING OUT THE INVENTION

Figure 1A:
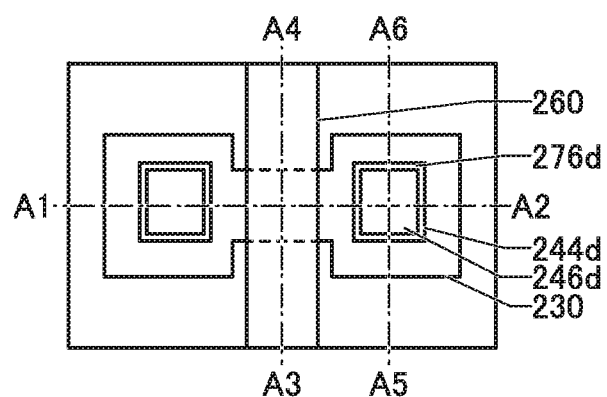
FIG. 1 (A), (E) Top views of semiconductor devices of embodiments of the present invention. (B), (C), (D), (F) Cross-sectional views of the semiconductor devices of embodiments of the present invention.

Hereinafter, embodiments will be described with reference to the drawings. Note that the embodiments can be implemented with many different modes, and it is readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Thus, they are not limited to the illustrated scale. Note that the drawings are schematic views illustrating ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatch pattern is used for the portions having similar functions, and the portions are not especially denoted by reference numerals in some cases.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description are not limited to those used in this specification, and the description can be rephrased appropriately depending on the situation.

In this specification and the like, a transistor is an element having at least three terminals of a gate, a drain, and a source. The transistor has a region where a channel is formed between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeably used in this specification and the like.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In this specification and the like, "parallel" indicates a state where two straight lines are placed at an angle of greater than or equal to −10° and less than or equal to 10°. Accordingly, the case where the angle is greater than or equal to −5° and less than or equal to 5° is also included. In addition, the term "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, a transistor having normally-on characteristics is a transistor that is on when a gate voltage is 0 V. For example, the normally-on characteristics of a transistor mean, in some cases, electrical characteristics in which current (Id) flows between a drain and a source when a voltage applied to a gate of the transistor (Vg) is 0 V.

In this specification and the like, an oxide semiconductor is a type of metal oxide. A metal oxide means an oxide containing a metal element. A metal oxide exhibits insulating properties, semiconductor properties, or conductivities depending on its composition or formation method. A metal oxide exhibiting semiconductor properties is referred to as a metal oxide semiconductor or an oxide semiconductor (or simply OS). A metal oxide exhibiting insulating properties is referred to as a metal oxide insulator or an oxide insulator. A metal oxide exhibiting conductivities is referred to as a metal oxide conductor or an oxide conductor. In other words, a metal oxide used in a channel formation region or the like of a transistor can be referred to as an oxide semiconductor.

Embodiment 1

In this embodiment, a semiconductor device that is one embodiment of the present invention will be described with reference to FIG. 1 to FIG. 11.

Structure Example 1 of Semiconductor Device

FIG. 1 selectively shows a region of a semiconductor device that is one embodiment of the present invention and includes a plurality of transistors. FIG. 1(A) is a top view of a region including a transistor 200. FIG. 1(B) is a cross-sectional view of a portion indicated by dashed-dotted line A5-A6 in FIG. 1(A). FIG. 1(C) is a cross-sectional view of a portion indicated by dashed-dotted line A1-A2 in FIG. 1(A). FIG. 1(D) is a cross-sectional view of a portion indicated by dashed-dotted line A3-A4 in FIG. 1(A). Note that for clarity of the drawing, some components are not illustrated in FIG. 1.

With the miniaturization of a transistor, a plug electrically connected to the transistor or a conductor used for a wiring also requires miniaturization. In contrast, the plug or the wiring is oxidized by oxygen contained in interlayer films and the like, whereby a resistance is increased in some cases. Increasing of the resistance of the plug or the wiring causes a decrease in operation speed of a semiconductor device, an increase in power consumption of a semiconductor device, or the like. In particular, the influence is remarkable in the case where the plug or the wiring is miniaturized.

Thus, the semiconductor device of one embodiment of the present invention includes the transistor 200, a conductor 244s electrically connected to the transistor 200, a conductor 246s and an insulator 276s over the conductor 244s, a conductor 244d electrically connected to the transistor 200, and a conductor 246d and an insulator 276d over the conductor 244d.

Note that one or both of the conductor 244s and the conductor 244d are referred to as a conductor 244 in some cases. Similarly, in some cases, one or both of the insulator 276s and the insulator 276d are referred to as an insulator 276, and one or both of the conductor 246s and the conductor 246d are referred to as a conductor 246.

As illustrated in FIG. 1, the transistor 200 includes at least a conductor 260 functioning as a first gate and a semiconductor layer 230 including a region where a channel is formed (hereinafter also referred to as a channel formation region).

In one embodiment of the present invention, the conductor 244, the conductor 246, and the insulator 276 are provided inside an opening (also referred to as a contact hole or a via hole) provided in an interlayer film. However, in some cases, the conductor 246 or the insulator 276 is also provided outside the opening, for example, at a higher position than the top surface of the interlayer film. Note that the opening is provided so that at least the semiconductor layer 230 is exposed.

Here, as the integration degree of a semiconductor device becomes higher, the distance between a plug and a plug, and the distance between a plug and another electrode (e.g., a gate electrode) become shorter. As a result, the parasitic capacitance increases, and the operation speed of the semiconductor device is decreased in some cases. Thus, when the insulator 276 is provided between the conductor 246 and the interlayer film, an increase in parasitic capacitance can be suppressed, and the operation speed of the semiconductor device can be further increased even in the case where the semiconductor device is highly integrated.

The plug or the wiring is also miniaturized when the semiconductor device is highly integrated. Due to the miniaturization, the plug or the wiring is oxidized easily, and the resistance might become higher. Thus, when an insulator having a function of inhibiting diffusion of oxygen is used for the insulator 276, the plug or the wiring can be inhibited from being oxidized and having higher resistance.

As the material having a barrier property against oxygen, for example, an oxide containing one or more kinds selected from hafnium, aluminum, boron, gallium, zinc, yttrium, zirconium, tungsten, titanium, tantalum, nickel, germanium, magnesium, and the like, or a nitride containing aluminum or silicon can be used for the insulator 276.

With the miniaturization of the transistor, the contact areas between the semiconductor layer 230, and the source electrode and the drain electrode also tend to be reduced. That is, the contact resistance between the semiconductor layer 230, and the source electrode and the drain electrode might increase, and on-state characteristics of the transistor might decrease. It is preferable that the contact area between the semiconductor layer 230, the source electrode, and the drain electrode be as large as possible even when the transistor is miniaturized to keep high on-state characteristics of the transistor.

The conductor 244 is provided between the semiconductor layer 230, and the insulator 276 and the conductor 246. When the conductor 244 is provided, the contact area between the semiconductor layer 230, and the source electrode and the drain electrode can be larger than that when the conductor 244 is not provided. That is, with such a structure, the contact area between the semiconductor layer 230, and the source electrode and the drain electrode is increased, so that the contact resistance can be reduced.

For example, in the case where a shape of the opening seen from the above is rectangular, the width on one side of the opening is extremely small, whereby the width of the conductor 246 functioning as a plug or a wiring on the one side of the opening is also extremely small. In the case where the shape of the opening seen from the above is circular (including an elliptical shape), the width on the diameter (a major axis or a minor axis in the case of an elliptical shape) is extremely small, whereby the width on one side of the conductor 246 functioning as a plug or a wiring is also extremely small. Here, the width of the conductor 246 is smaller than the width on one side of the conductor opening by the thickness of the insulator 276.

Specifically, the opening is a square in which the length of one side is 22 nm, for example. When the thickness of the insulator 276 is 5 nm per side (10 nm on both sides of the opening), the length of one side of the conductor 246 is reduced to 12 nm. That is, when the conductor 244 is not provided, the contact area between the semiconductor layer 230 and the conductor 246 becomes approximately 30%. In contrast, by providing the conductor 244, the contact resistance can be reduced because the width of the conductor 244 and the width of the opening can be substantially the same.

The above is an example, and reduction of the contact area between the conductor 246 and the semiconductor layer 230 can be inhibited by thinning the insulator 276. However, a barrier property might be reduced when the insulator 276 is thinned; thus, the kind or the thickness of the insulator 276 is preferably optimized as appropriate so that the resistance of the conductor 246 can be extremely low.

Note that the conductor 244 desirably includes a hardly oxidizable material. When hardly oxidizable material is used for the conductor 244, the conductor 244 itself can be inhibited from being oxidized and having higher resistance. As a result, the on-state characteristics of the transistor can be increased. As the hardly oxidizable material, tantalum nitride, tungsten nitride, titanium nitride, ruthenium, platinum, iridium, silver, gold, a titanium-aluminum alloy, or a nitride of a titanium-aluminum alloy can be used, for example. Alternatively, a stacked-layer film with tantalum, tungsten, titanium, molybdenum, aluminum, copper, or a molybdenum-tungsten alloy can be used.

A conductive metal oxide may be used for the conductor 244. When the conductive metal oxide is used even in a state where the conductor 244 contains oxygen, an increasing resistance due to oxygen absorption of the conductor 244 can be inhibited. As a result, the on-state characteristics of the transistor can be increased. Examples of the conductive metal oxide include indium tin oxide (ITO), indium tin oxide containing silicon (ITSO), zinc oxide (ZnO), indium tin oxide containing zinc, zinc oxide containing gallium (GZO), zinc oxide containing aluminum (AZO), tin oxide ($SnO_2$), tin oxide containing fluorine (FTO), tin oxide containing aluminum (ATO), and ruthenium oxide. In addition, an In—Ga—Zn-based oxide having high conductivity may be used, for example.

For the conductor 244, a semiconductor having high electric conductivity, polycrystalline silicon containing an impurity element such as phosphorus, or silicide such as nickel silicide may be used. For the conductor 244, a conductor that forms a conductive compound by reacting with the semiconductor layer 230 may be used.

Meanwhile, the conductor 246 is preferably formed using a conductive material with high embeddability such as tungsten or polysilicon. A conductive material with high embeddability and a layer with high adhesion to the semiconductor layer 230 such as a titanium layer, a titanium nitride layer, or a tantalum nitride layer and the conductive material with high embeddability may be used in combination.

In the case where the opening is formed in a slit-like shape and the conductor 244 and the conductor 246, or a conductor that is formed through the same step as those is used as a wiring, a conductive material that has high conductivity and contains tungsten, copper, or aluminum as its main component is preferably used. For example, when a conductive material containing copper is used for the conductor 246, the conductor 244 is preferably formed using a conductive material having a barrier property against copper. Furthermore, the insulator 276 is preferably formed using an insulating material having a barrier property against copper.

As the conductive material having a barrier property against copper, for example, tantalum, tantalum nitride, tungsten, tungsten nitride, titanium, titanium nitride, ruthenium, or ruthenium oxide can be used. As the insulating material having a barrier property against copper, for example, silicon nitride, aluminum oxide, aluminum nitride, hafnium oxide, zirconium oxide, boron oxide, gallium oxide, yttrium oxide, tantalum oxide, or magnesium oxide can be used. Note that the conductor 244 and the conductor 246 may each have a stacked-layer structure.

Figure 1B:
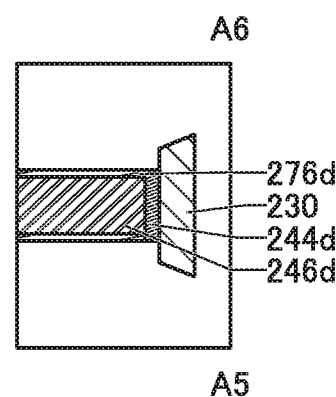
Figure 1C:
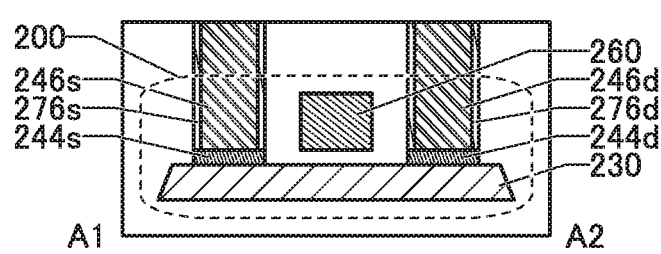
Figure 1D:
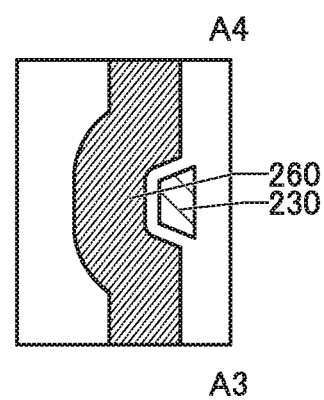

Specifically, in FIG. 1(A), FIG. 1(B), and FIG. 1(C), the insulator 276 has a tubular shape and the conductor 246 is provided in an inner portion of (also referred as inside) the insulator 276. A side surface of the conductor 244 and an outer surface of the insulator 276 are on the same plane. With such a structure, oxidation of the conductor 246 can be inhibited and the contact resistance with the semiconductor layer 230 can be reduced.

Thus, it is preferable that a projected area of the conductor 244 be larger than a projected area of the conductor 246. The sum of the projected area of the conductor 244 and the projected area of the insulator 276 is preferably equivalent to the projected area of the conductor 244.

For the semiconductor layer 230, a single crystal semiconductor, a polycrystalline semiconductor, a microcrystalline semiconductor, an amorphous semiconductor, or the like can be used alone or in combination.

As the semiconductor material, for example, an oxide semiconductor such as a metal oxide can be used. For example, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In oxide, a Zn oxide, an In—Ga oxide, or an In—Zn oxide may be used for the semiconductor layer 230.

As a semiconductor material, silicon, germanium, or the like can be used. A compound semiconductor such as silicon germanium, silicon carbide, gallium arsenide, an oxide semiconductor, or a nitride semiconductor, an organic semiconductor, or the like can be used.

In the case of using an organic semiconductor for a semiconductor layer, for example, a low molecular organic material having an aromatic ring, a 7c-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductors having different crystal states may be used or different semiconductor materials may be used.

Structure Example 2 of Semiconductor Device

Figure 1E:
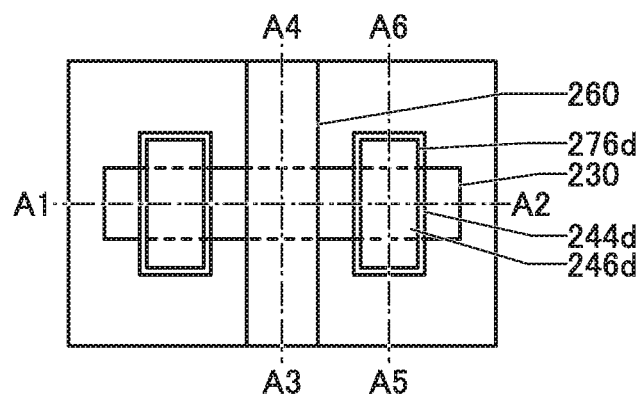
Figure 1F:
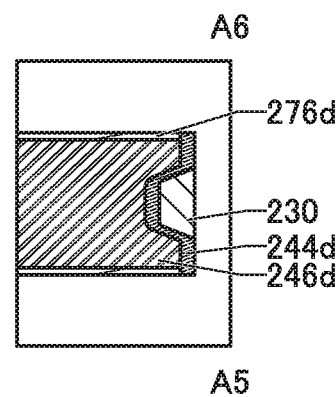

As illustrated in FIG. 1(E) and FIG. 1(F), a structure in which an opening is provided to extend to the outside of the semiconductor layer 230 may be employed, for example. At this time, the semiconductor layer 230 may have a linear shape. Although the semiconductor layer 230 is shown as a liner shape in the diagram, it may have a curve. The semiconductor layer 230 is provided one-dimensionally, whereby a minute shape can be easily formed. A structure in which a width of a semiconductor layer is constant is preferable because the layout design flexibility is increased. That is, miniaturization and high integration of the transistor are easily performed.

As described above, the contact resistance between the semiconductor layer 230 and the source electrode or the drain electrode tends to become higher when a semiconductor device is highly integrated. Thus, as illustrated in FIG. 1(E) and FIG. 1(F), the opening provided in the interlayer film is preferably provided to have a diameter larger than a width in the W length direction of the semiconductor 230. In other words, a top surface and a side surface of the semiconductor layer 230 are exposed at a bottom portion of the opening provided in the interlayer film. Thus, the conductor 244 is in contact with the top surface and the side surface of the semiconductor layer 230, so that the contact resistance can be reduced.

<Method for Manufacturing Semiconductor Device>

Next, a method for manufacturing the semiconductor device of the present invention, which includes the transistor 200 and is illustrated in FIG. 1, will be described with reference to FIG. 2 to FIG. 5. In FIG. 2 to FIG. 5, (A) and (D) of each drawing are top views. (B) of each drawing is a cross-sectional view corresponding to a portion indicated by dashed-dotted line A5-A6 in (A). In addition, (C) of each drawing is a cross-sectional view corresponding to a portion indicated by dashed-dotted line A1-A2 in (A). Moreover, (E) of each drawing is a cross-sectional view corresponding to a portion indicated by dashed-dotted line A5-A6 in (D). Furthermore, (F) of each drawing is a cross-sectional view corresponding to a portion indicated by dashed-dotted line A1-A2 in (D). Note that for clarity of the drawing, some components are not illustrated in the top view of (A) in each drawing.

Figure 2A:
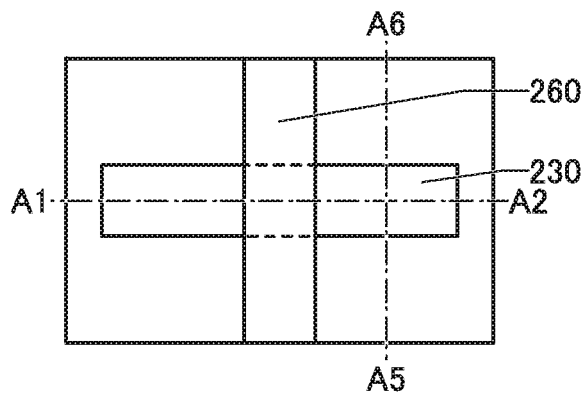
FIG. 2 (A) to (F) Views illustrating a manufacturing method of a semiconductor device of one embodiment of the present invention.
Figure 2B:
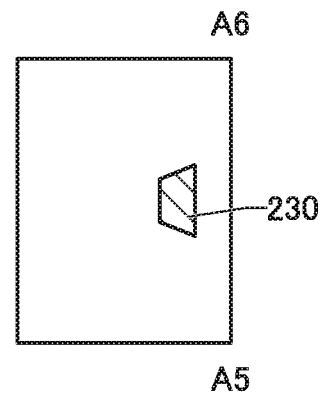
Figure 2C:
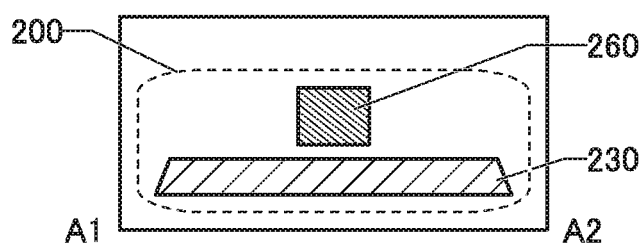

As illustrated in FIG. 2(A), FIG. 2(B), and FIG. 2(C), the transistor 200 including the semiconductor layer 230 and the conductor 260 is formed. Then, an interlayer film is formed to cover the transistor 200.

Figure 2D:
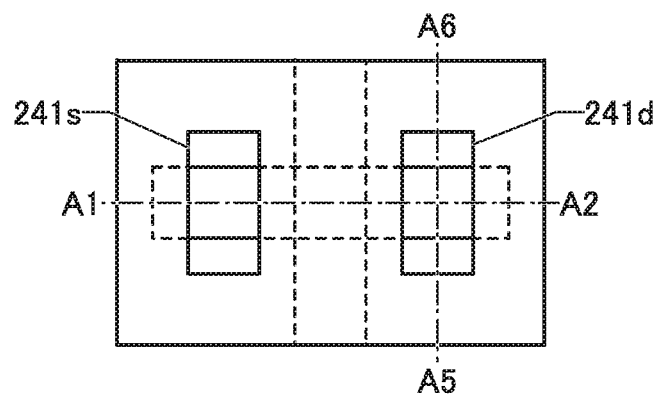
Figure 2E:
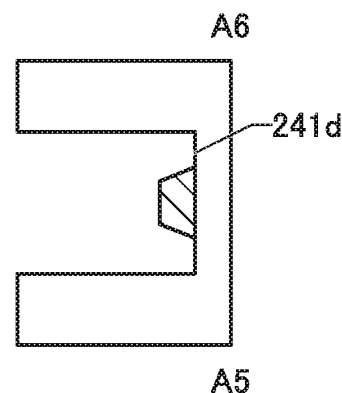
Figure 2F:
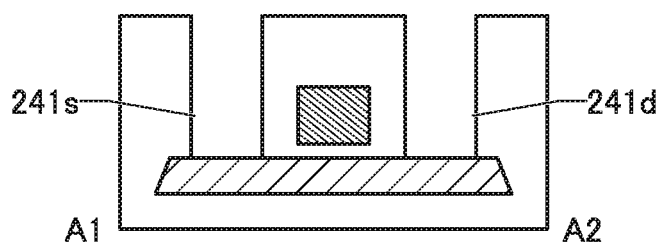

Next, as illustrated in FIG. 2(D), FIG. 2(E), and FIG. 2(F), an opening 241s and an opening 241d exposing the semiconductor layer 230 are formed. Note that examples of the opening include a groove and a slit. A wet etching method may be used for the formation of the opening; however, a dry etching method is preferable for microfabrication.

Here, side surfaces of the opening 241s and the opening 241d are preferably perpendicular to a substrate or form, with a substrate, a high angle that is substantially a right angle. When the side surfaces of the opening 241s and the opening 241d are substantially perpendicular to the substrate, a plurality of transistors 200 can be provided in a smaller area and at a higher density.

Figure 3A:
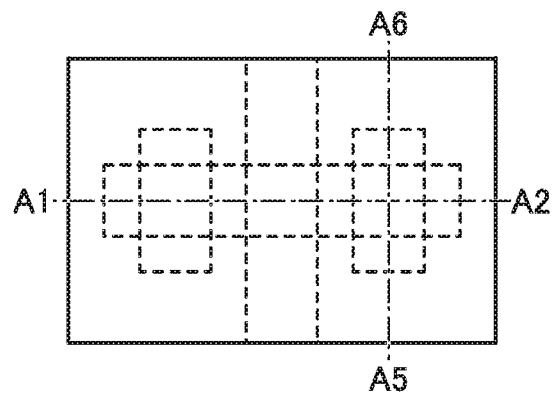
FIG. 3 (A) to (F) Views illustrating a manufacturing method of a semiconductor device of one embodiment of the present invention.
Figure 3B:
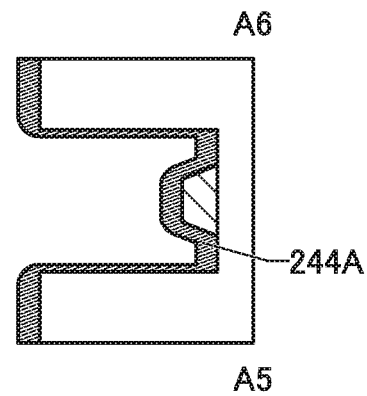
Figure 3C:
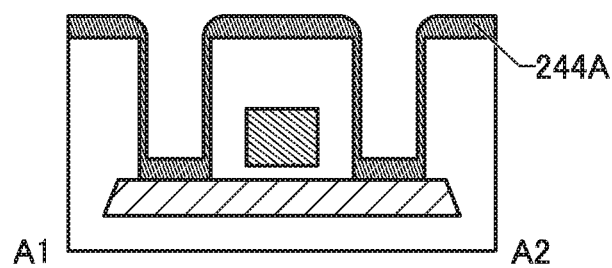

Subsequently, a conductive film 244A is deposited to cover the semiconductor layer 230 and the opening 241 as illustrated in FIG. 3(A), FIG. 3(B), and FIG. 3(C). Here, the conductive film 244A is deposited at least only on the bottom portion of the opening 241. That is, it is preferable that the conductive film 244A not be provided on a side surface of the opening or the conductive film 244A be provided so that the thickness of the conductive film 244A covering the side surface of the opening is smaller than the thickness of the conductive film 244A covering the bottom portion of the opening.

In order to deposit the conductive film 244A having different thicknesses in the side surface and the bottom portion of the opening, for example, a collimated sputtering method, a low pressure long throw sputtering method, an ionization sputtering method (including a sputtering method using an unbalanced magnet), a sputtering method in which DC power and RF power overlap with each other, a sputtering method in which a capacitance value on a substrate side is variable, a sputtering method in which a bias is applied to a substrate side, or a sputtering method in which any of these are combined can be used. Alternatively, the conductive film 244A may be deposited by a CVD method or the like to grow selectively only on the bottom portion of the opening.

Figure 3D:
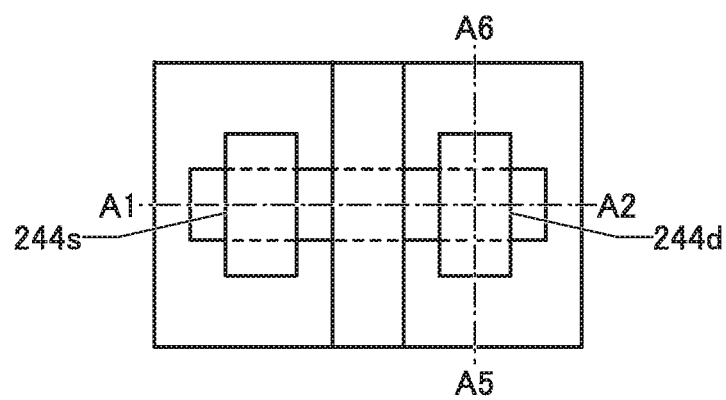
Figure 3E:
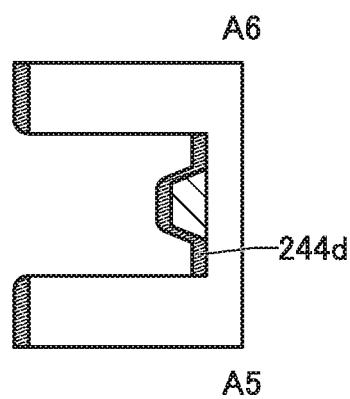
Figure 3F:
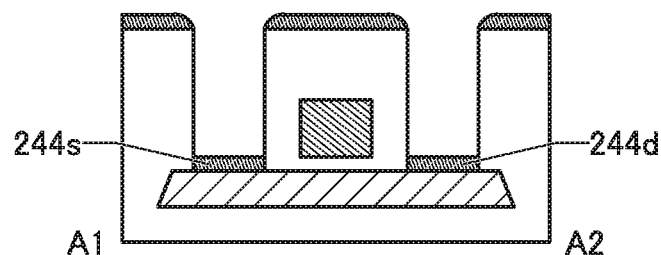

In the case where the conductive film 244A is deposited on the side surface of the opening, the conductive film 244A formed on the side surface of the opening is removed, so that the conductor 244 is formed as illustrated in FIG. 3(D), FIG. 3(E), and FIG. 3(F). For example, the conductive film 244A may be removed by a wet etching method or a dry etching method until the side surface of the opening is exposed. Thus, the thickness of the conductor 244 is smaller than the thickness of the conductive film 244A formed on the bottom portion of the opening in some cases.

Figure 4A:
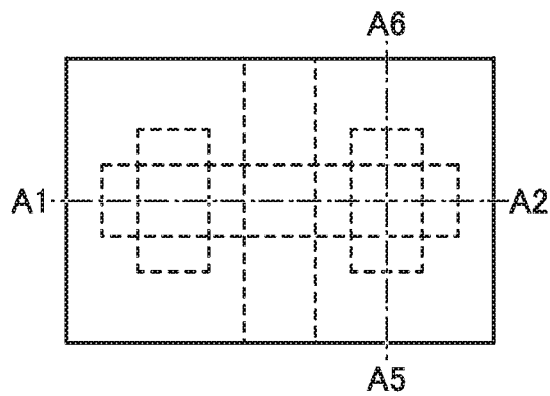
FIG. 4 (A) to (F) Views illustrating a manufacturing method of a semiconductor device of one embodiment of the present invention.
Figure 4B:
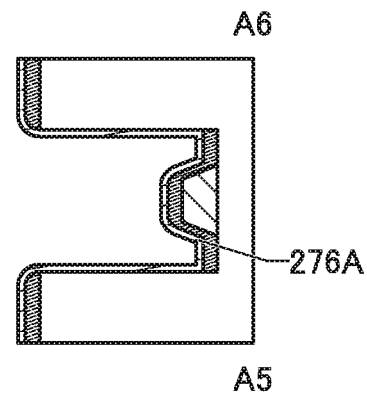
Figure 4C:
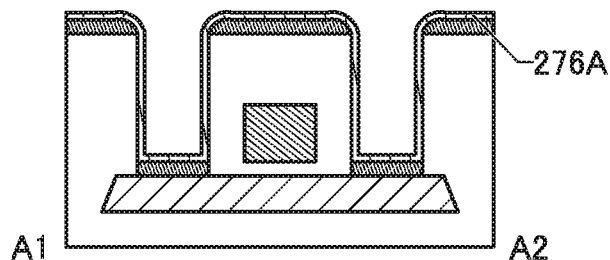

Next, an insulating film 276A is deposited to cover the conductor 244 and the side surface of the opening as illustrated in FIG. 4(A), FIG. 4(B), and FIG. 4(C). As the insulating film 276A, an insulating film having a barrier property against oxygen is used. The insulating film 276A can be deposited by a sputtering method, a CVD method, an MBE method, a PLD method, an ALD method, or the like.

Here, by setting the thickness of the insulating film 276A as appropriate, the proportion of the area where the insulator 276 and the opening are in contact with each other in the area of the opening can be determined. That is, the insulating film 276A is preferably formed as thin and uniform as possible so that a plug or a wiring can be miniaturized. Thus, the insulating film 276A is preferably deposited by an ALD method. When an insulating layer is formed by an ALD method, a dense film with a smaller number of defects such as cracks and pinholes or with a uniform thickness can be formed to have a small thickness.

Figure 4D:
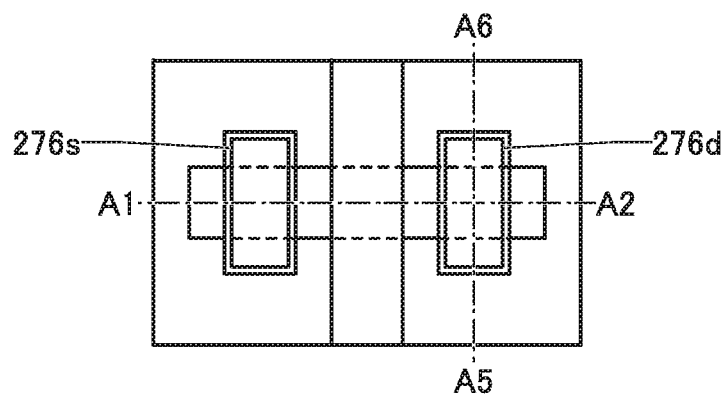
Figure 4E:
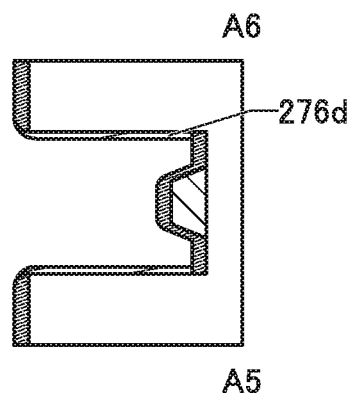
Figure 4F:
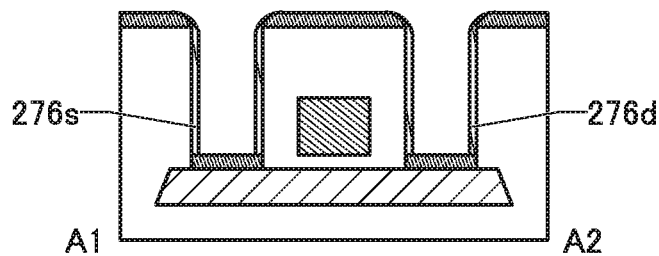

Subsequently, part of the insulating film 276A is removed and the conductor 244 is exposed, so that the insulator 276 is formed as illustrated in FIG. 4(D), FIG. 4(E), and FIG. 4(F). For the processing, anisotropic dry etching can be used.

Figure 5A:
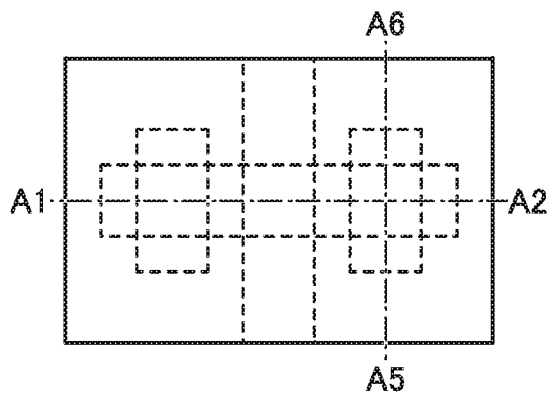
FIG. 5 (A) to (F) Views illustrating a manufacturing method of a semiconductor device of one embodiment of the present invention.
Figure 5B:
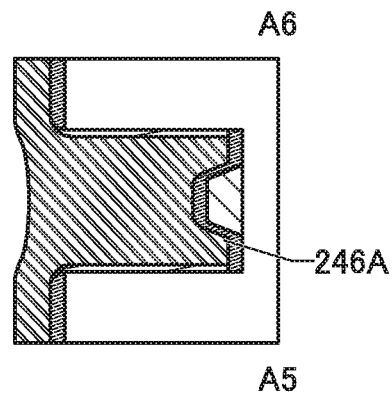
Figure 5C:
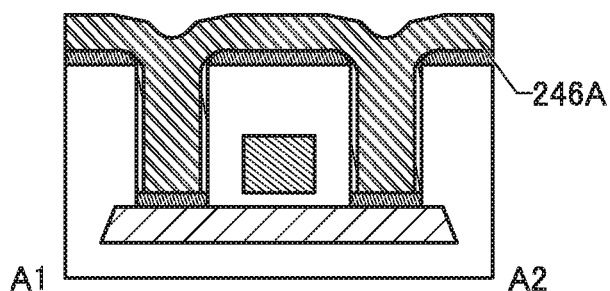

Next, a conductive film 246A is deposited to cover the conductor 244 and the insulator 276 as illustrated in FIG. 5(A), FIG. 5(B), and FIG. 5(C). For the conductive film 246A, a conductive material containing tungsten, copper, or aluminum as its main component is preferably used. The conductive film 246A may have a stacked-layer structure.

Figure 5D:
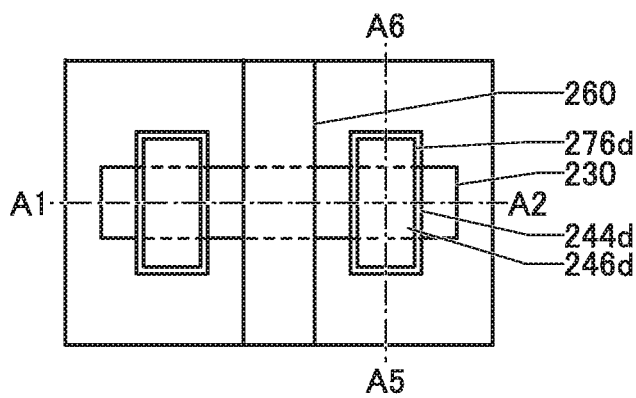
Figure 5E:
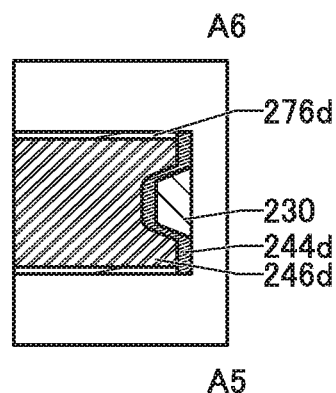
Figure 5F:
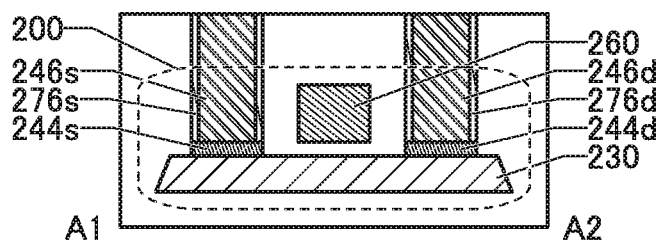

Next, the interlayer film is exposed by removing a structure body including part of the conductive film 246A as illustrated in FIG. 5(D), FIG. 5(E), and FIG. 5(F). In this step, CMP (chemical mechanical polishing) treatment can be used, for example. By the CMP treatment, an unnecessary structure body is removed and the interlayer film is exposed, whereby the conductor 246 remains only in the opening. Note that the interlayer film is partly removed by the CMP treatment in some cases. Depending on a selectivity ratio of the CMP, part of the insulator 276 and the conductor 246 might be positioned at higher or lower level than a top surface of the interlayer film.

Thus, when the conductor 244, the conductor 246, and the insulator 276 that inhibits oxidation are provided inside the opening, miniaturization and high integration of the semiconductor device can be easily performed. In addition, the operation speed of the semiconductor device can be improved. Furthermore, the power consumption of the semiconductor device can be reduced.

The composition, structure, method, and the like described above in this embodiment can be used in an appropriate combination with the compositions, structures, methods, and the like described in the other embodiments.

Embodiment 2

In this embodiment, structure examples of the transistor 200 shown in the above embodiment will be described with reference to FIG. 6 to FIG. 11. Note that the transistor 200 described in this embodiment includes an oxide semiconductor.

Here, a metal oxide including indium is preferably used as the oxide semiconductor. For example, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, hafnium, tantalum, tungsten, magnesium, and the like) can be used. Furthermore, as the oxide semiconductor, an In—Ga oxide or an In—Zn oxide may be used.

For example, a transistor using an oxide semiconductor in a region where a channel is formed has an extremely low leakage current in a non-conduction state; thus, a semiconductor device with low power consumption can be provided.

Moreover, with the use of an oxide semiconductor, a variety of elements can be stacked to achieve three-dimensional integration. That is, an oxide semiconductor can be deposited by a sputtering method or the like; thus, not only a circuit developed on a plane of a substrate but also a three-dimensional integrated circuit developed in the perpendicular direction can be obtained.

Note that each structure of an element can be formed by repeating deposition of a film using a material suitable for each structure and processing and shaping of the film.

Transistor Structure Example 1

Figure 6A:
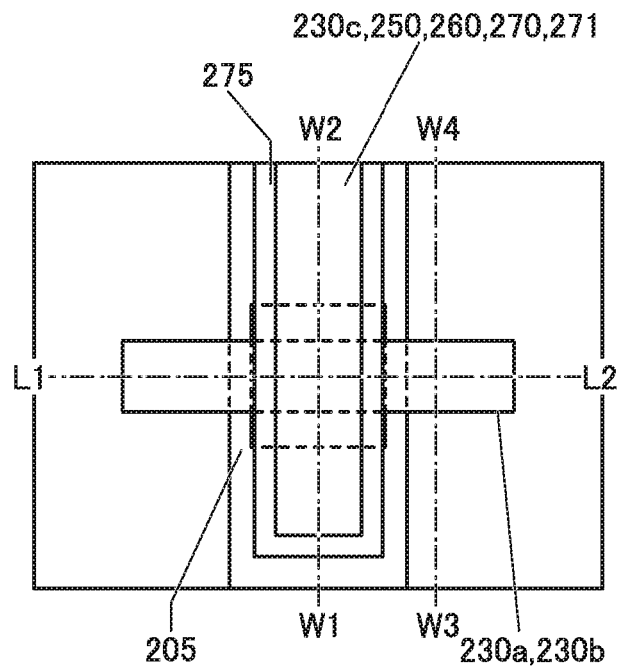
FIG. 6 (A) A top view of a semiconductor device of one embodiment of the present invention. (B), (C), (D) Cross-sectional views of the semiconductor device of one embodiment of the present invention.
Figure 6C:
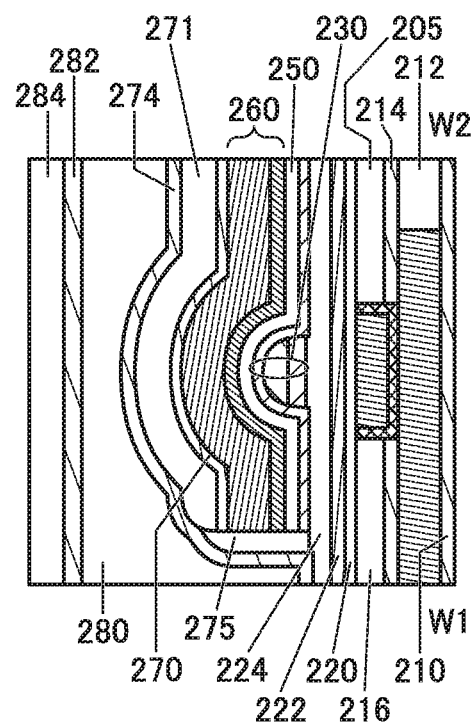
Figure 6B:
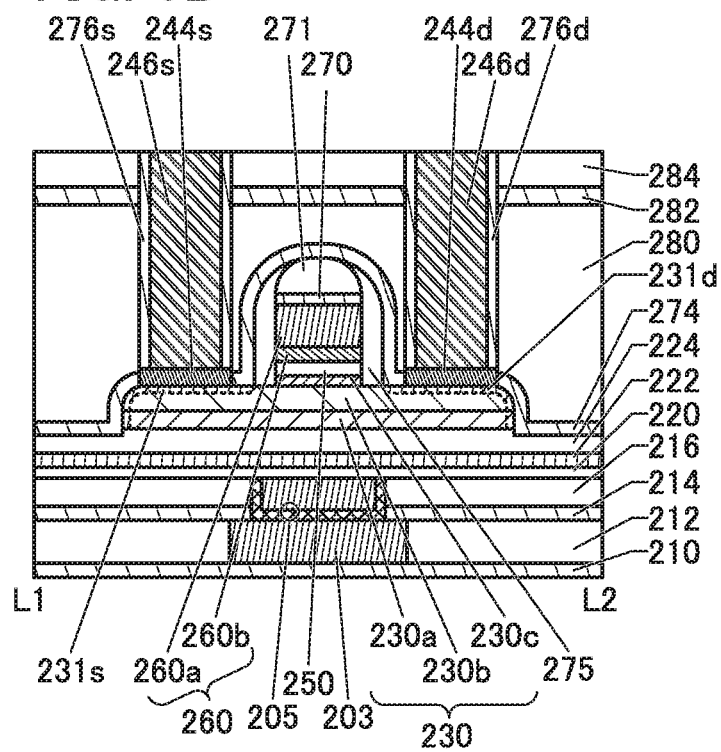
Figure 6D:
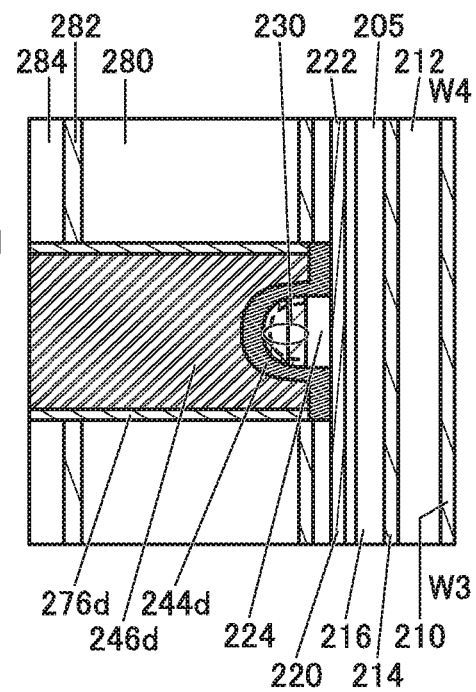

A structure example of a transistor 200A will be described below with reference to FIG. 6 and FIG. 7. FIG. 6(A) is a top view of the transistor 200A. Note that for clarity of the drawing, some components are not illustrated in the top view in FIG. 6(A). FIG. 6(B) is a cross-sectional view of a portion indicated by dashed-dotted line L1-L2 in FIG. 6(A). FIG. 6(C) is a cross-sectional view of a portion indicated by dashed-dotted line W1-W2 in FIG. 6(A). FIG. 6(D) is a cross-sectional view of a portion indicated by dashed-dotted line W3-W4 in FIG. 6(A). In addition, FIG. 7 is a cross-sectional view showing a region in which the conductor 260 and a conductor 203 in FIG. 6(C) are extended.

Figure 7:
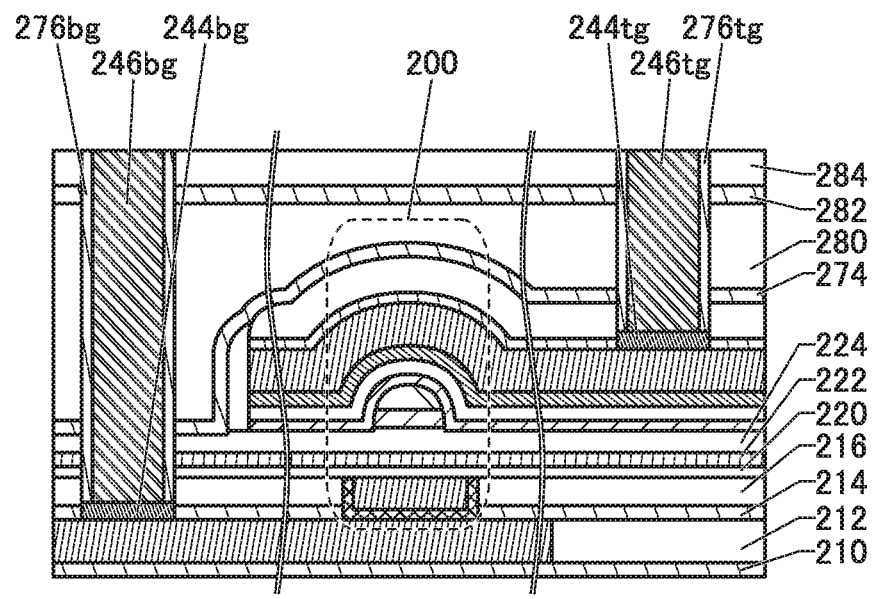
FIG. 7 A cross-sectional view of a semiconductor device of one embodiment of the present invention.

In FIG. 6 and FIG. 7, the transistor 200A and an insulator 210, an insulator 212, an insulator 214, an insulator 216, an insulator 280, an insulator 282, an insulator 284, and the insulator 276 (the insulator 276s, the insulator 276d, an insulator 276tg, and an insulator 276bg) functioning as interlayer films are illustrated. In addition, the conductor 244 (the conductor 244s, the conductor 244d, a conductor 244tg, and a conductor 244bg) and the conductor 246 (the conductor 246s, the conductor 246d, a conductor 246tg, and a conductor 246bg) which are electrically connected to the transistor 200A and functions as a contact plug, and the conductor 203 functioning as a wiring are illustrated.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. In addition, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 210, the insulator 214, the insulator 216, and the insulator 282 preferably function as a barrier film that inhibits entry of impurities such as water and hydrogen into the transistor 200A from the substrate side. This structure can inhibit diffusion of impurities such as water and hydrogen to the transistor 200A side from the substrate side of the above insulators.

Accordingly, for the insulator 210, the insulator 214, the insulator 216, the insulator 280, and the insulator 284, it is preferable to use an insulating material that has a function of inhibiting diffusion of impurities such as hydrogen, water, and copper (through which the above impurities do not easily pass). Alternatively, it is preferable to use an insulating material that has a function of inhibiting diffusion of oxygen (through which oxygen is less likely to pass). For example, aluminum oxide or silicon nitride may be used for the above insulators.

For example, the permittivity of the insulator 212 and the insulator 216 is preferably lower than that of the insulator 210. When a material with a low permittivity is used for the interlayer film, the parasitic capacitance generated between wirings can be reduced.

The conductor 203 is formed to be embedded in the insulator 212. Here, the level of a top surface of the conductor 203 and the level of a top surface of the insulator 212 can be substantially the same. Note that although a structure in which the conductor 203 is a single layer is illustrated, the present invention is not limited thereto. For example, the conductor 203 may have a multilayer film structure of two or more layers. Note that for the conductor 203, a conductive material that has high conductivity and contains tungsten, copper, or aluminum as its main component is preferably used.

The transistor 200A includes the conductor 260 (a conductor 260a and a conductor 260b) functioning as a first gate (also called top gate) electrode, a conductor 205 functioning as a second gate (also called bottom gate) electrode, an insulator 250 functioning as a first gate insulator, an insulator 220, an insulator 222, and an insulator 224 functioning as second gate insulators, the semiconductor layer 230 (a semiconductor layer 230a, a semiconductor layer 230b, and a semiconductor layer 230c) including a region where a channel is formed, an insulator 270, an insulator 275, an insulator 271, and an insulator 274.

The semiconductor layer 230 includes a region 231s and a region 231d. One of the region 231s and the region 231d functions as a source region, and the other functions as a drain region. The region 231 (the region 231s and the region 231d) contains an element that reduces the resistance of the semiconductor layer 230 in addition to a constituent element of the semiconductor layer and is a region with reduced resistance. Note that the element that reduces the resistance of the semiconductor layer 230 includes not only an element that itself serves as a donor or an acceptor and generates carriers in the semiconductor layer 230 but also an element that generates carriers in the semiconductor layer 230 indirectly when the element is added.

As the element that reduces the resistance, boron or phosphorus is typically used in the case where an oxide semiconductor is used for the semiconductor layer 230. Hydrogen, carbon, nitrogen, fluorine, sulfur, chlorine, titanium, a rare gas, or the like may also be used. Typical examples of the rare gas include helium, neon, argon, krypton, and xenon. Note that for the addition of the element, an ion implantation method by which an ionized source gas is subjected to mass separation and then added, an ion doping method by which an ionized source gas is added without mass separation, a plasma immersion ion implantation method, or the like can be used.

Here, in the transistor 200, a metal oxide functioning as an oxide semiconductor (hereinafter also referred to as an oxide semiconductor) is preferably used for the semiconductor layer 230. A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor included in a highly integrated semiconductor device.

On the other hand, in some cases, a transistor using an oxide semiconductor has its electrical characteristics changed by impurities and oxygen vacancies in the oxide semiconductor; accordingly, the reliability is decreased. In the case where hydrogen is contained in the oxide semiconductor, hydrogen reacts with oxygen bonded to a metal atom by heat treatment or the like and produces water; as a result, oxygen vacancies are formed in the oxide semiconductor in some cases. Entry of hydrogen into the oxygen vacancy (a site in which oxygen has existed) generates an electron serving as a carrier in some cases. Accordingly, a transistor using an oxide semiconductor including a large number of oxygen vacancies is likely to have normally-on characteristics. Thus, it is preferable that oxygen vacancies in the oxide semiconductor be reduced as much as possible.

In order to reduce oxygen vacancies in the oxide semiconductor, an oxide that contains more oxygen than oxygen in the stoichiometric composition is preferably placed near the oxide semiconductor. For example, in the insulator 224, the insulator 250, and the insulator 275, a region containing oxygen in excess of that in the stoichiometric composition (hereinafter also referred to as an excess-oxygen region) is preferably formed. The excess oxygen is diffused into the oxide semiconductor, whereby oxygen vacancies can be compensated for.

For the insulator including an excess-oxygen region, specifically, an oxide material that releases part of oxygen by heating is preferably used. An oxide that releases oxygen by heating is an oxide film in which the amount of released oxygen converted into oxygen molecules is greater than or equal to $1.0 \times 10^{18}$ molecules/cm$^3$, preferably greater than or equal to $3.0 \times 10^{20}$ molecules/cm$^3$ in TDS analysis. Note that the temperature of the film surface in the TDS analysis is preferably in a range of higher than or equal to 100° C. and lower than or equal to 700° C., or higher than or equal to 100° C. and lower than or equal to 500° C.

For example, the insulator 224, the insulator 250, and the insulator 275 are preferably insulators that contain oxygen, such as a silicon oxide film or a silicon oxynitride film. Note that in this specification, silicon oxynitride refers to a material that contains more oxygen than nitrogen in its composition, and silicon nitride oxide refers to a material that contains more nitrogen than oxygen in its composition.

The insulator 222 and the insulator 274 preferably have a barrier property. When the insulator 222 and the insulator 274 have a barrier property, diffusion of impurities to the semiconductor layer 230 can be inhibited. Thus, impurities and generation of oxygen vacancies in the oxide semiconductor can be inhibited.

For the insulator 222 and the insulator 274, a single layer or stacked layers of an insulator such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example.

In particular, an insulator containing a high-k material is preferably used for the insulator 222. As miniaturization and high integration of a transistor progress, a problem such as leakage current might arise because of a thinner gate insulator. When a high-k material is used for an insulator functioning as the gate insulator, a gate voltage during operation of the transistor can be reduced while the physical thickness of the gate insulator is kept.

The insulator 220 may be provided. For example, it is preferable that the insulator 220 be thermally stable. Since silicon oxide and silicon oxynitride are thermally stable, combination of silicon oxide or silicon oxynitride with the insulator 222 using an insulator of a high-k material can constitute a stacked-layer structure that is thermally stable and has a high dielectric constant, for example.

When voltage is applied to the second gate electrode in the transistor 200A, the threshold voltage of the transistor 200A can be controlled. In particular, the threshold voltage of the transistor 200A can be higher than 0 V and the off-state current can be reduced by applying a negative voltage to the second gate electrode. That is, when a negative voltage is applied to the second gate electrode, a drain current when a potential applied to the first gate electrode is 0 V can be reduced.

For example, when the first gate electrode and the second gate electrode are provided to overlap with each other, an electric field generated from the first gate electrode and an electric field generated from the second gate electrode can cover the channel formation region formed in the semiconductor layer 230 in the case where the same potential is applied to each electrode.

That is, the channel formation region can be electrically surrounded by the electric field of the first gate electrode and the electric field of the second gate electrode. In this specification, a transistor structure in which a channel formation region is electrically surrounded by electric fields of the first gate electrode and the second gate electrode is referred to as a surrounded channel (S-channel) structure.

In the conductor 205 functioning as the second gate, a first conductor is formed in contact with an inner wall of an opening in the insulator 214 and the insulator 216, and a second conductor is formed on the inner side. Although the transistor 200 having a structure in which the first conductor and the second conductor are stacked is illustrated, the present invention is not limited thereto. For example, the conductor 205 may have a single-layer structure or a stacked-layer structure of three or more layers.

Here, for the first conductor of the conductor 205, a conductive material which has a function of inhibiting diffusion of impurities such as water, hydrogen, and copper (through which the above impurities are less likely to pass) is preferably used. Alternatively, it is preferable to use a conductive material which has a function of inhibiting diffusion of oxygen (through which oxygen is less likely to pass). As the conductive material which has a function of inhibiting diffusion of oxygen, for example, tantalum, tantalum nitride, ruthenium, or ruthenium oxide is preferably used. When the first conductor of the conductor 205 has a function of inhibiting diffusion of oxygen, the conductivity of the second conductor of the conductor 205 can be prevented from being lowered because of oxidization.

In the case where the conductor 205 doubles as a wiring, the second conductor of the conductor 205 is preferably formed using a conductive material that has high conductivity and contains tungsten, copper, or aluminum as its main component. Note that the second conductor of the conductor 205 is a single layer in the drawing but may have a stacked-layer structure; for example, a stack of any of the above conductive materials and titanium or titanium nitride may be employed.

The conductor 260 functioning as the first gate electrode includes the conductor 260a and the conductor 260b over the conductor 260a. Like the first conductor of the conductor 205, the conductor 260a is preferably formed using a conductive material having a function of inhibiting diffusion of impurities such as water, hydrogen, and copper. Alternatively, it is preferable to use a conductive material that has a function of inhibiting diffusion of oxygen.

When the conductor 260a has a function of inhibiting oxygen diffusion, the range of choices for the material of the conductor 260b can be expanded. That is, when the conductor 260a is included, oxidization of the conductor 260b is inhibited, whereby a decrease in conductivity can be prevented.

As the conductive material which has a function of inhibiting diffusion of oxygen, for example, tantalum, tantalum nitride, ruthenium, or ruthenium oxide is preferably used. For the conductor 260a, the oxide semiconductor that can be used for the semiconductor layer 230 can be used. In that case, by using a conductor that absorbs oxygen for the conductor 260b, oxygen vacancies are formed in the oxide semiconductor that is the conductor 260a and the oxide semiconductor can have a reduced electric resistance to be a conductor. This can be referred to as an OC (Oxide Conductor) electrode.

The conductor 260 functions as a wiring and thus is preferably formed using a conductor having high conductivity. For example, for the conductor 260b, a conductive material containing tungsten, copper, or aluminum as its main component can be used. The conductor 260b may have a stacked-layer structure; for example, a stack of any of the above conductive materials and titanium or titanium nitride may be employed.

Furthermore, the insulator 270 functioning as a barrier film may be positioned over the conductor 260. For the insulator 270, an insulating material having a function of inhibiting the passage of oxygen and impurities such as water and hydrogen is preferably used. For example, aluminum oxide or hafnium oxide is preferably used. Thus, oxidation of the conductor 260 can be prevented. Moreover, this can prevent entry of impurities such as water and hydrogen into the oxide 230 through the conductor 260 and the insulator 250.

The insulator 271 functioning as a hard mask is preferably positioned over the insulator 270. By provision of the insulator 270, in processing the conductor 260, a side surface of the conductor 260 can be substantially perpendicular; specifically, an angle formed by the side surface of the conductor 260 and the surface of the substrate can be greater than or equal to 75° and less than or equal to 100°, preferably greater than or equal to 80° and less than or equal to 95°. That is, the conductor 260 can be miniaturized.

Furthermore, the insulator 275 is preferably provided between the conductor 260 and the conductor 244. The insulator 275 is provided in contact with at least the side surfaces of the conductor 260 and the insulator 270. The insulator 275 is preferably formed using a material having a relatively high insulation resistance such as silicon oxide. With miniaturization and high integration of transistors, a physical distance between the conductor 260 and the conductor 246 becomes shorter; thus, a problem such as formation of parasitic capacitance or leakage current arises in some cases. Accordingly, when the insulator 275 is provided, electrical characteristics of the transistor can be improved.

The conductor 244, the conductor 246, and the insulator 276 described in Embodiment 1 are provided in the transistor 200A illustrated in FIG. 6 and FIG. 7. Here, in the case where an oxide semiconductor is used for the semiconductor layer 230, damage to the semiconductor layer 230 in processing can be reduced in the transistor 200 by providing the conductor 244.

That is, when the conductor 244 is not provided, the insulator 276 is deposited over and in contact with the semiconductor layer 230 that is formed using the oxide semiconductor. In the case where the insulator 276 is formed by anisotropic etching, the etching damage to the semiconductor layer 230 or the insulator 224 is caused in the anisotropic etching. When a metal oxide is used for the insulator 276, etching rates of the semiconductor layer 230 and the insulating film 276A are close to each other, and thus it is difficult to obtain a favorably processed shape. Meanwhile, by providing the conductor 244, to cover the semiconductor layer 230, on the bottom portion of the opening that expose the semiconductor layer 230, processing can be performed using the etching selectivity between the conductor 244 and the insulator 276. Thus, a favorably processed shape can be obtained by appropriate selection of the material of the conductor 244.

With the above structure, a semiconductor device including a transistor with a high on-state current can be provided. Alternatively, a semiconductor device including a transistor with a low off-state current can be provided. Alternatively, a semiconductor device that has small variations in electrical characteristics, stable electrical characteristics, and high reliability can be provided.

Transistor Structure Example 2

Figure 8A:
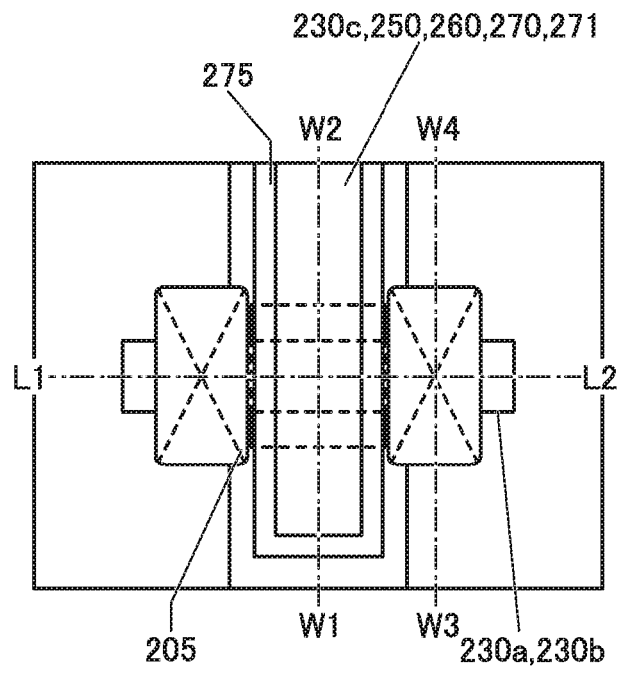
FIG. 8 (A) A top view of a semiconductor device of one embodiment of the present invention. (B), (C), (D) Cross-sectional views of the semiconductor device of one embodiment of the present invention.
Figure 8C:
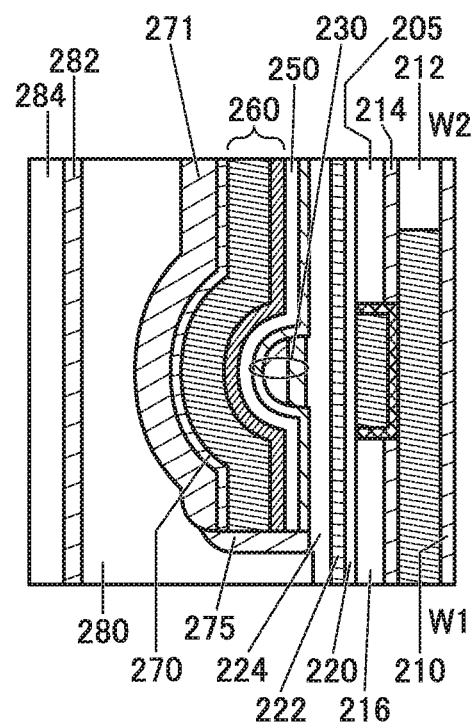
Figure 8B:
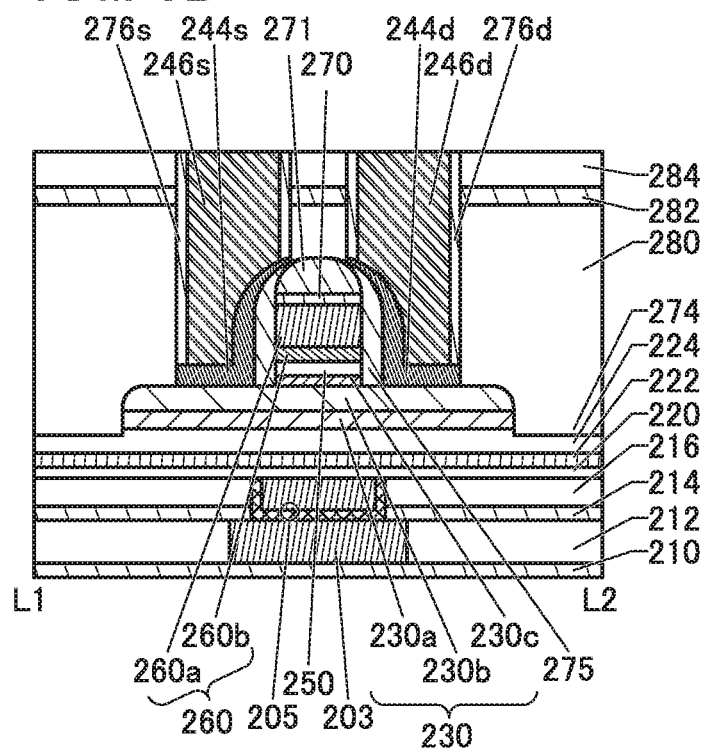
Figure 8D:
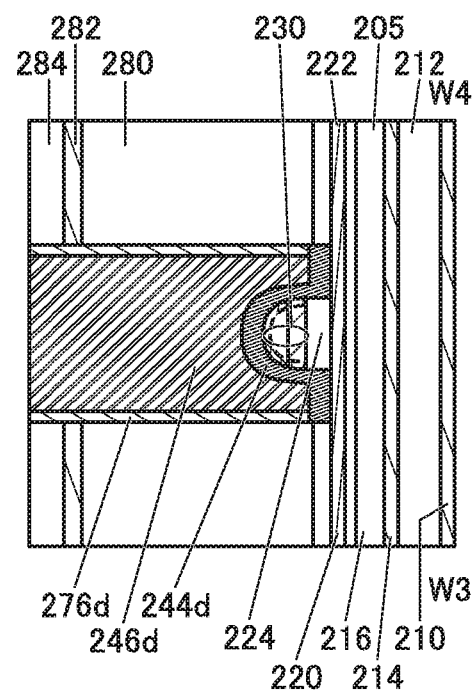

A structure example of a transistor 200B will be described below with reference to FIG. 8. FIG. 8(A) is a top view of the transistor 200B. FIG. 8(B) is a cross-sectional view of a portion indicated by dashed-dotted line L1-L2 in FIG. 8(A). FIG. 8(C) is a cross-sectional view of a portion indicated by dashed-dotted line W1-W2 in FIG. 8(A). FIG. 8(D) is a cross-sectional view of a portion indicated by dashed-dotted line W3-W4 in FIG. 8(A). Note that for clarity of the drawing, some components are not illustrated in the top view in FIG. 8(A).

The transistor 200B is a variation example of the transistor 200A. Thus, differences from the transistor 200A will be mainly described to avoid repeated description.

The opening 241s or the opening 241d formed in the interlayer film may be provided so as to expose a side surface of the insulator 275 and a top surface of the insulator 270. This structure can be formed when etching conditions are set such that the etching rates of the insulator 275 and the insulator 270 are extremely lower than the etching rate of the insulator 280 at the time of forming the opening in the insulator 280. For example, when the etching rate of the insulator 275 is 1, the etching rate of the insulator 280 is preferably 5 or more, further preferably 10 or more.

Accordingly, even in the case where the insulator 270 and the insulator 275 are exposed in removing part of 280, the insulator 270 and the insulator 275 are not removed. In other word, the components of the transistor 200B such as the conductor 260 and the insulator 250 positioned inside the insulators are protected. With this structure, the opening 241 can be formed in a self-aligned manner.

With the use of the structure illustrated in FIG. 8, a margin for alignment of the opening and the gate electrode can be increased, and the distance between the opening and the gate electrode can be designed to be small; thus, the semiconductor device can be highly integrated.

Transistor Structure Example 3

Figure 9A:
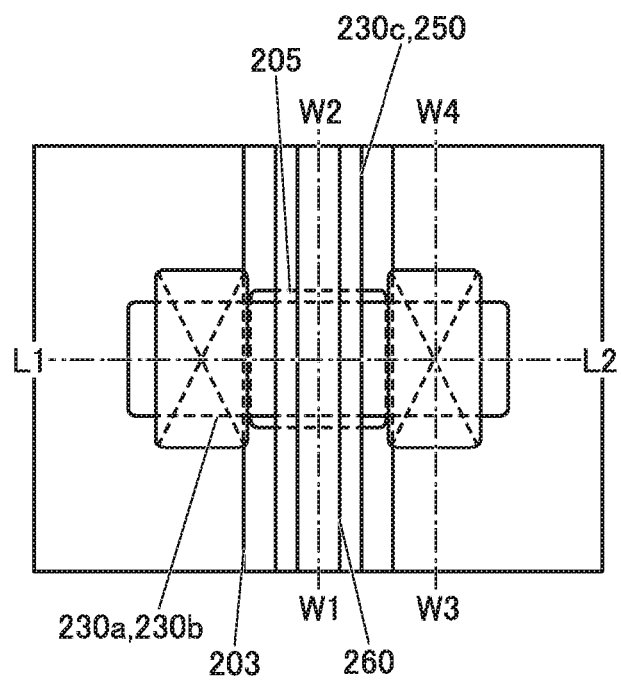
FIG. 9 (A) A top view of a semiconductor device of one embodiment of the present invention. (B), (C), (D) Cross-sectional views of the semiconductor device of one embodiment of the present invention.
Figure 9C:
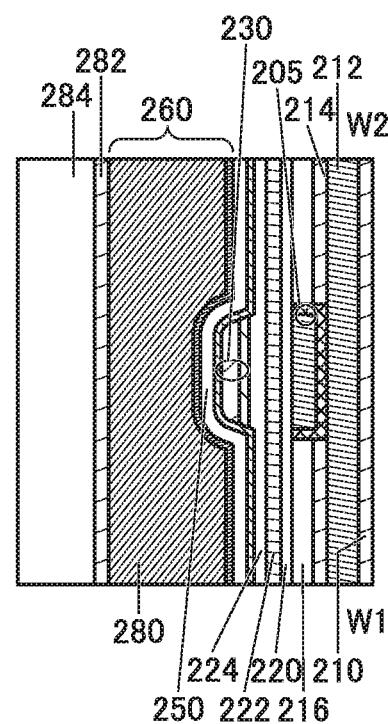
Figure 9B:
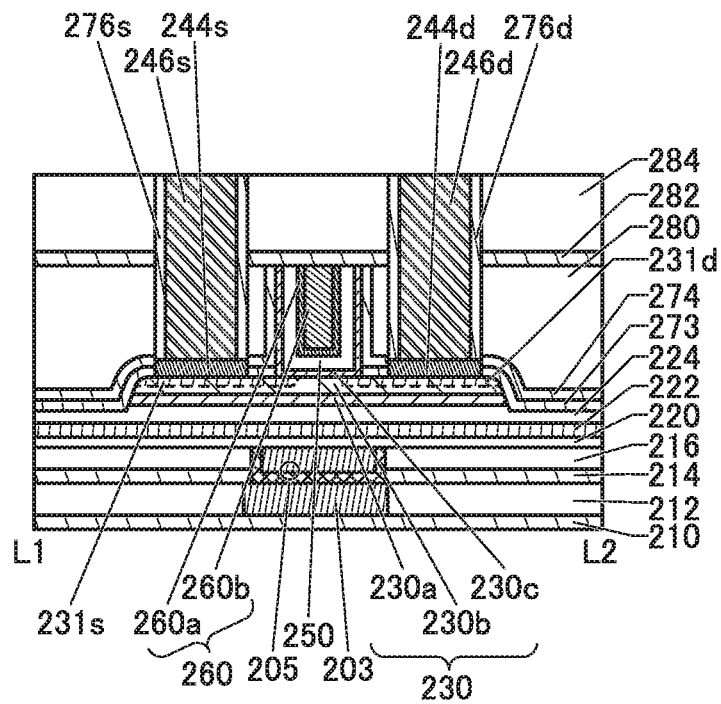
Figure 9D:
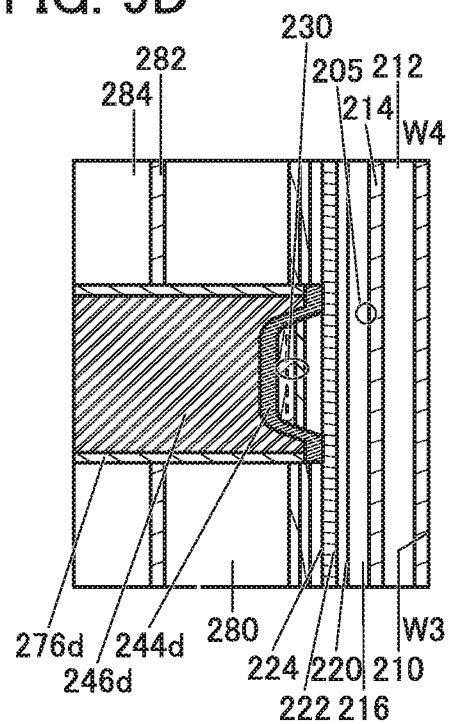

A structure example of a transistor 200C will be described with reference to FIG. 9. FIG. 9(A) is a top view of the transistor 200C. FIG. 9(B) is a cross-sectional view of a portion indicated by dashed-dotted line L1-L2 in FIG. 9(A). FIG. 9(C) is a cross-sectional view of a portion indicated by dashed-dotted line W1-W2 in FIG. 9(A). FIG. 9(D) is a cross-sectional view of a portion indicated by dashed-dotted line W3-W4 in FIG. 9(A). Note that for clarity of the drawing, some components are not illustrated in the top view in FIG. 9(A).

The transistor 200C is a variation example of the transistor 200A. Thus, differences from the transistor 200A will be mainly described to avoid repeated description.

In the transistor 200C illustrated in FIG. 9, the semiconductor layer 230c, the insulator 250, and the conductor 260 are positioned in an opening provided in the insulator 280 with the insulator 274 having a barrier property positioned therebetween.

Note that the semiconductor layer 230c is preferably provided in the opening provided in the insulator 280 with the insulator 274 positioned therebetween. The insulator 250 functions as a first gate insulating layer. The insulator 250 is preferably provided in the opening provided in the insulator 280 with the semiconductor layer 230c and the insulator 274 positioned therebetween.

In this structure, the insulator 274 is positioned between the insulator 280 and the transistor 200B. For the insulator 274, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide, silicon nitride oxide, or silicon nitride.

The insulator 274 can inhibit diffusion of impurities such as water and hydrogen contained in the insulator 280 into the semiconductor layer 230b through the semiconductor layer 230c and the insulator 250.

Transistor Structure Example 4

Figure 10A:
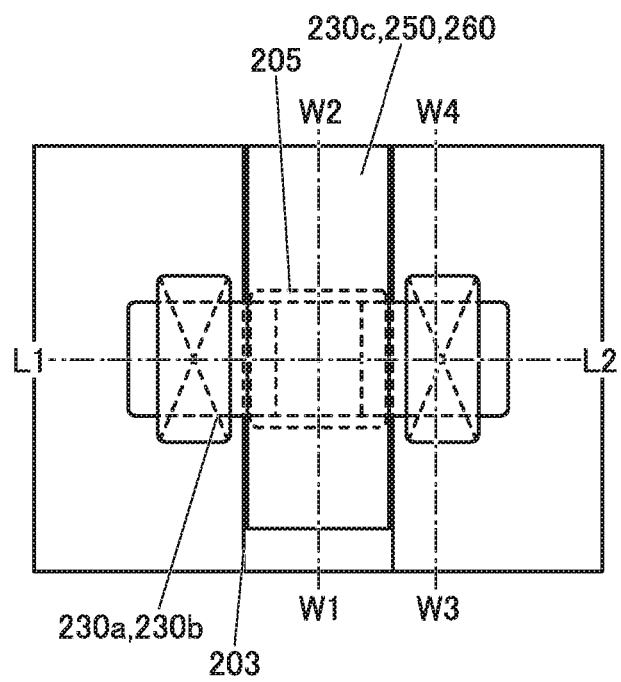
FIG. 10 (A) A top view of a semiconductor device of one embodiment of the present invention. (B), (C), (D) Cross-sectional views of the semiconductor device of one embodiment of the present invention.
Figure 10C:
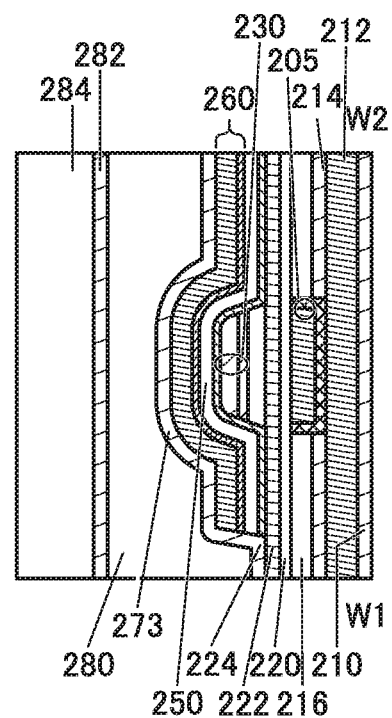
Figure 10B:
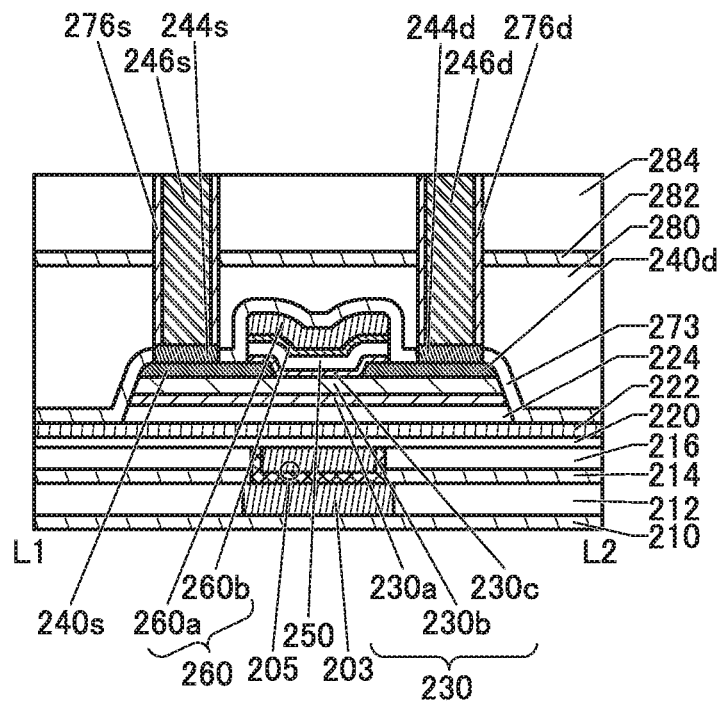
Figure 10D:
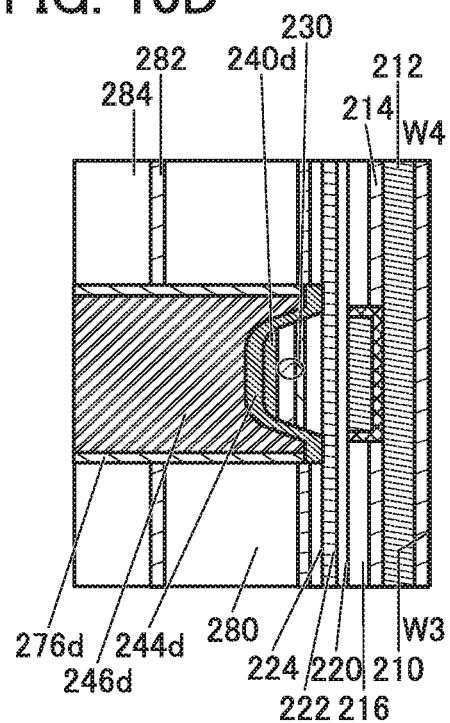

A structure example of a transistor 200D will be described with reference to FIG. 10. FIG. 10(A) is a top view of the transistor 200D. FIG. 10(B) is a cross-sectional view of a portion indicated by dashed-dotted line L1-L2 in FIG. 10(A). FIG. 10(C) is a cross-sectional view of a portion indicated by dashed-dotted line W1-W2 in FIG. 10(A). FIG. 10(D) is a cross-sectional view of a portion indicated by dashed-dotted line W3-W4 in FIG. 10(A). Note that for clarity of the drawing, some components are not illustrated in the top view in FIG. 10(A).

The transistor 200D is a variation example of the transistor 200A. Thus, differences from the transistor 200A will be mainly described to avoid repeated description.

The transistor 200D illustrated in FIG. 10 includes a conductor 240 (a conductor 240s and a conductor 240d). Note that one of the conductors 240 functions as a source electrode and the other functions as a drain electrode.

Note that for the conductor 240, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; and the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The conductor 240 includes a region where the semiconductor layer 230c, the insulator 250, and the conductor 260 overlap with each other. With this structure, a transistor having a high on-state current can be provided. Moreover, a transistor having high controllability can be provided.

Meanwhile, a step portion between the semiconductor layer 230b and the conductor 240 corresponding to the thickness of the conductor 240 is formed. The semiconductor layer 230c and the insulator 250 are embedded in the step portion; thus, it is difficult to miniaturize the transistor 200D. Hence, the conductor 240 is preferably deposited as thin as possible. However, when the thickness of the conductor 240 is small, the conductor 240 is removed at the time of forming the opening 241, whereby the semiconductor layer 230 is also exposed to the processing atmosphere a shape defects occurs; thus, variation in electrical characteristics of the transistor is caused. Moreover, the conductor 240 is not formed on the side surface of the semiconductor layer 230; thus, it is highly probable that the semiconductor layer 230 is damaged.

Accordingly, the conductor 244, the conductor 246, and the insulator 276 described in Embodiment 1 are provided for the transistor 200D. In other words, damage to the semiconductor layer 230 in processing can be reduced by providing the conductor 244 on the side surface of the semiconductor layer 230 and on the side surface and the top surface of the conductor 240. Furthermore, the contact resistance can be reduced even when the conductor 240 is formed to be thin.

Transistor Structure Example 5

Figure 11A:
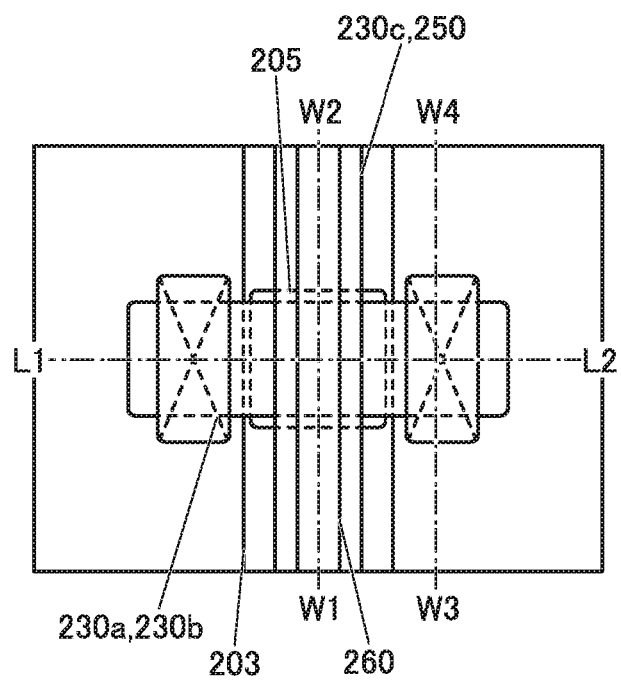
FIG. 11 (A) A top view of a semiconductor device of one embodiment of the present invention. (B), (C), (D) Cross-sectional views of the semiconductor device of one embodiment of the present invention.
Figure 11C:
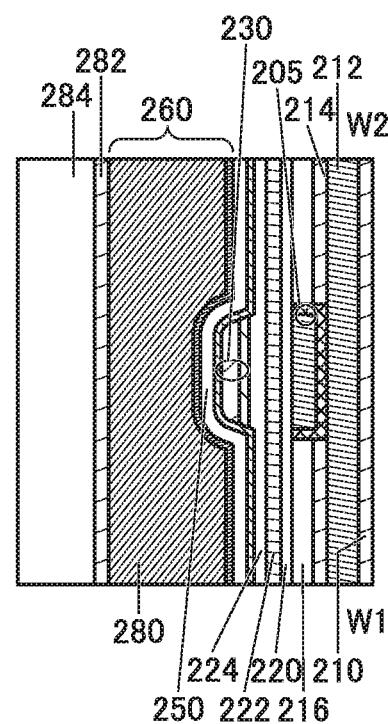
Figure 11B:
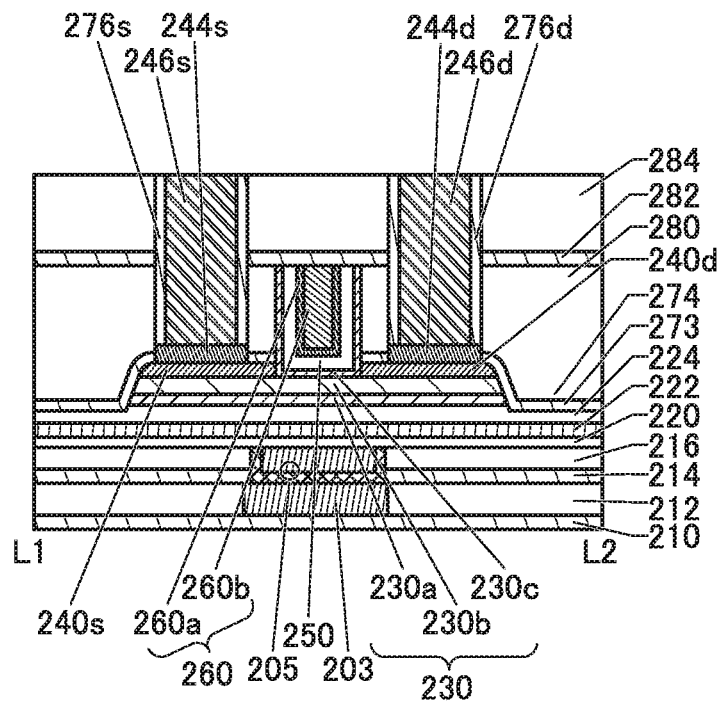
Figure 11D:
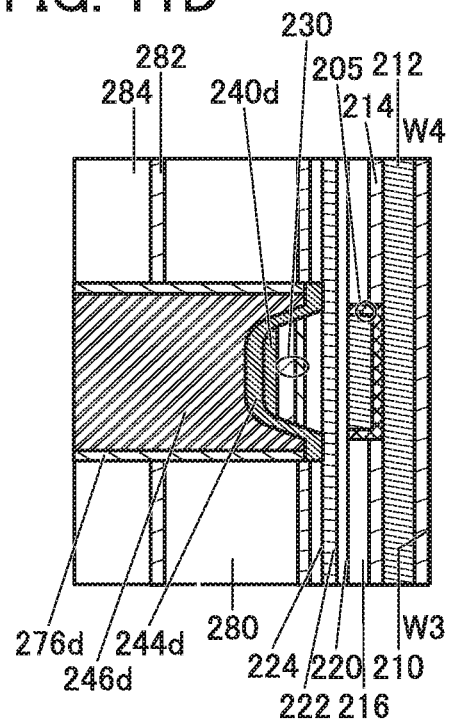

A structure example of a transistor 200E will be described with reference to FIG. 11. FIG. 11(A) is a top view of the transistor 200E. FIG. 11(B) is a cross-sectional view of a portion indicated by dashed-dotted line L1-L2 in FIG. 11(A). FIG. 11(C) is a cross-sectional view of a portion indicated by dashed-dotted line W1-W2 in FIG. 11(A). FIG. 11(D) is a cross-sectional view of a portion indicated by dashed-dotted line W3-W4 in FIG. 11(A). Note that for clarity of the drawing, some components are not illustrated in the top view in FIG. 11(A).

The transistor 200E is a variation example of the transistor 200B and the transistor 200D. Thus, differences from the transistor 200B and the transistor 200D will be mainly described to avoid repeated description.

The transistor 200D illustrated in FIG. 11 includes the conductor 240 (the conductor 240s and the conductor 240d). Note that one of the conductors 240 functions as a source electrode and the other functions as a drain electrode.

Note that the semiconductor layer 230c is preferably provided in the opening provided in the insulator 280. The insulator 250 functions as the first gate insulating layer. The insulator 250 is preferably provided in the opening provided in the insulator 280 with the semiconductor layer 230c positioned therebetween.

In this structure, the insulator 280 is in contact with the semiconductor layer 230c. Thus, an excess-oxygen region is preferably formed in the insulator 280. The excess oxygen is diffused into the oxide semiconductor, whereby oxygen vacancies can be compensated for.

This embodiment can be implemented in an appropriate combination with the structures described in the other embodiments, examples, and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is referred to as an OS memory device in some cases), is described with reference to FIG. 12 and FIG. 13. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 12A:
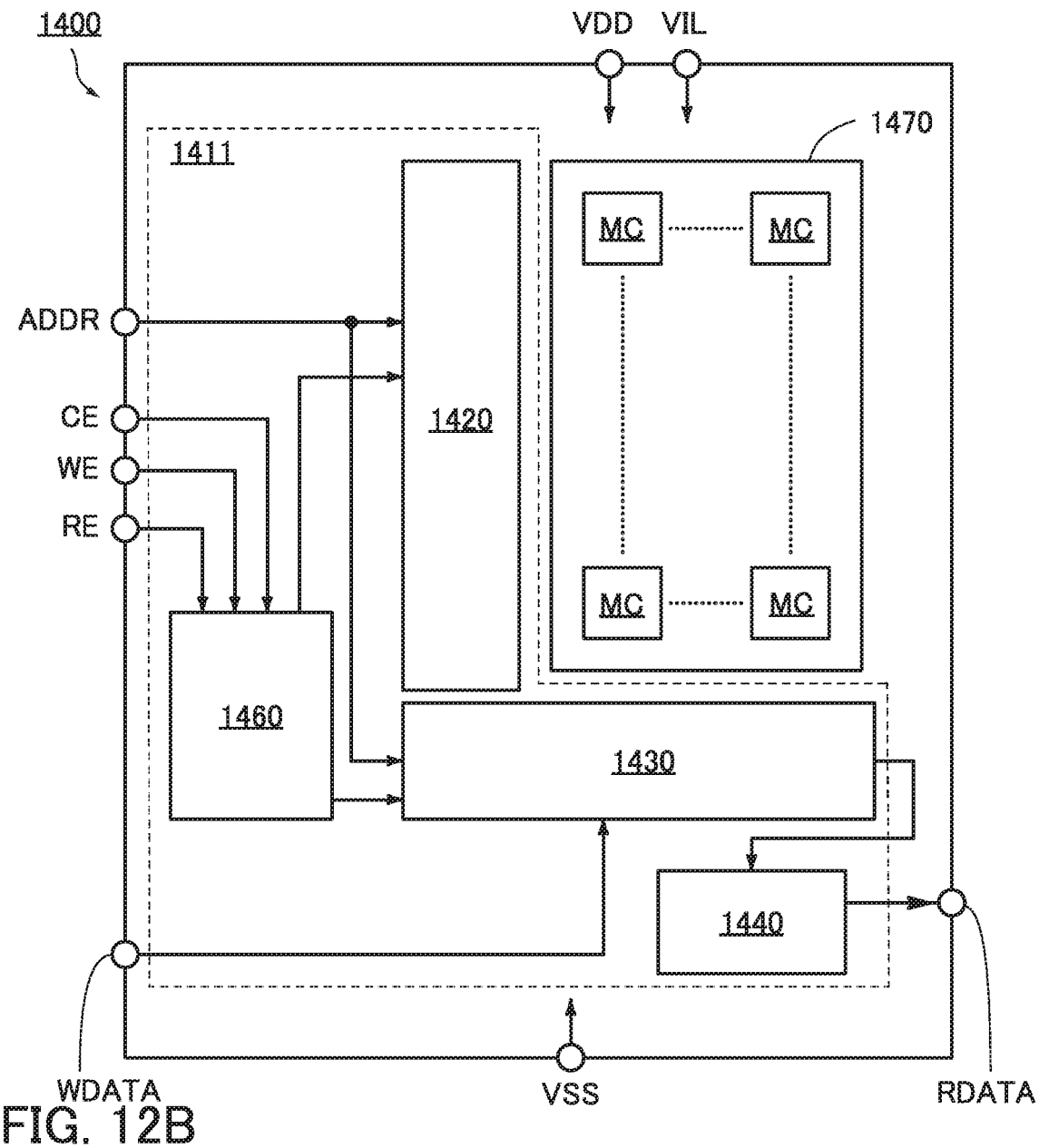
FIG. 12 (A) A block diagram illustrating a structure example of a memory device of one embodiment of the present invention. (B) A perspective view illustrating a structure example of the memory device of one embodiment of the present invention.

FIG. 12(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, and a write circuit. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 12B:
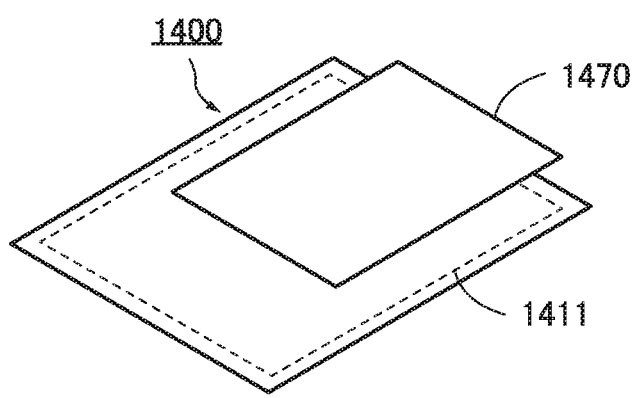

Note that FIG. 12(A) illustrates an example in which the peripheral circuit 1411 and the memory cell array 1470 are formed on the same plane; however, this embodiment is not limited thereto. For example, as illustrated in FIG. 12(B), the memory cell array 1470 may be provided over part of the peripheral circuit 1411 to overlap with the peripheral circuit 1411. For example, the sense amplifier may be provided below the memory cell array 1470 so that they overlap with each other.

FIG. 13 illustrates configuration examples of a memory cell applicable to the memory cell MC.

[DOSRAM]

Figure 13A:
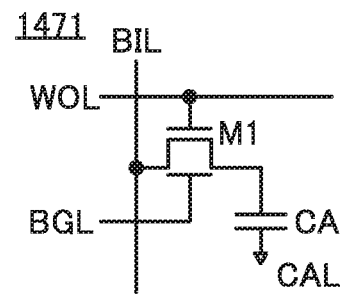
FIG. 13 (A) to (H) Circuit diagrams illustrating structure examples of a memory device of one embodiment of the present invention.
Figure 13B:
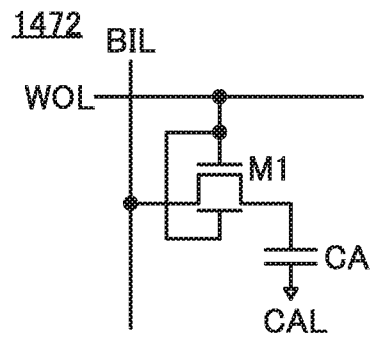
Figure 13C:
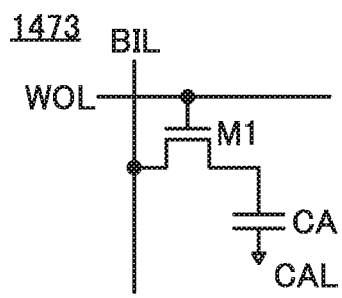
Figure 13D:
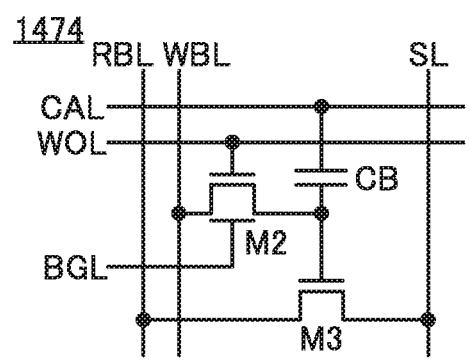
Figure 13E:
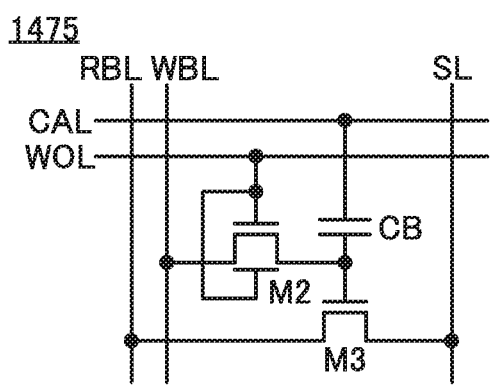
Figure 13F:
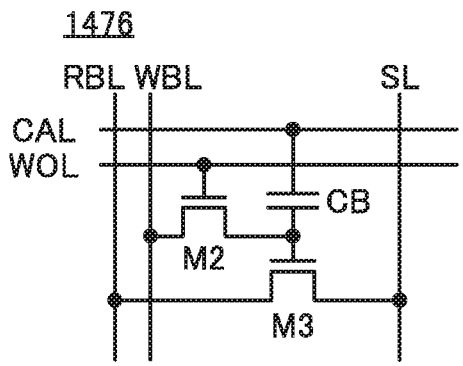
Figure 13G:
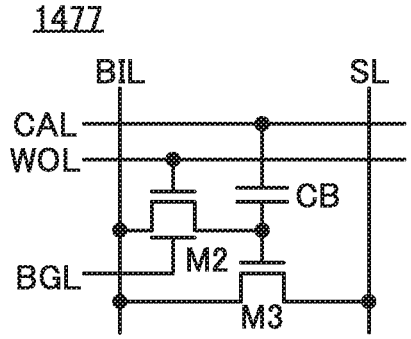

FIGS. 13(A) to 13(C) illustrate circuit configuration examples of a memory cell of a DRAM. In this specification and the like, a DRAM using a memory cell including one OS transistor and one capacitor is referred to as DOSRAM in some cases. A memory cell 1471 illustrated in FIG. 13(A) includes a transistor M1 and a capacitor CA. Note that the transistor M1 includes a gate (also referred to as a top gate in some cases) and a back gate.

A first terminal of the transistor M1 is connected to a first terminal of the capacitor CA, and a second terminal of the transistor M1 is connected to a wiring BIL. The gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and its circuit configuration can be changed. For example, as in a memory cell 1472 illustrated in FIG. 13(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, like a memory cell 1473 illustrated in FIG. 13(C).

In the case where the semiconductor device described in the above embodiment is used for the memory cell 1471 and the like, the transistor described in the above embodiment can be used as the transistor M1. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be omitted. In addition, an extremely low leakage current allows multi-level data or analog data to be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 13(D) to 13(H) illustrate circuit configuration examples of a gain-cell memory cell including two transistors and one capacitor. A memory cell 1474 illustrated in FIG. 13(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB, and a second terminal of the transistor M2 is connected to a wiring WBL. The gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, and a second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retaining, and data reading, a low-level potential is preferably applied to the wiring CAL. The wiring BGL functions as a wiring for applying a potential to the back gate of the transistor M2. Applying a given potential to the wiring BGL can increase or decrease the threshold voltage of the transistor M2.

The memory cell MC is not limited to the memory cell 1474, and its circuit configuration can be changed as appropriate. For example, as in a memory cell 1475 illustrated in FIG. 13(E), the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, like a memory cell 1476 illustrated in FIG. 13(F). Alternatively, for example, in the memory cell MC, the wiring WBL and the wiring RBL may be combined into one wiring BIL, as in a memory cell 1477 illustrated in FIG. 13(G).

In the case where the semiconductor device described in the above embodiment is used for the memory cell 1474 and the like, the transistor described in the above embodiment can be used as the transistor M2. When an OS transistor is used as the transistor M2, the leakage current of the transistor M2 can be extremely low. Accordingly, with the use of the transistor M2, written data can be retained for a long time, and thus the frequency of the refresh operation for the memory cell can be decreased. In addition, refresh operation of the memory cell can be omitted. In addition, an extremely low leakage current allows multi-level data or analog data to be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Thus, a Si transistor may be used as the transistor M3 functioning as a reading transistor. Furthermore, the transistor M2 can be provided to be stacked over the transistor M3 when a Si transistor is used as the transistor M3; thus, the area occupied by the memory cell can be reduced and high integration of the memory device can be achieved.

Alternatively, the transistor M3 may be an OS transistor. When an OS transistor is used as each of the transistor M2 and the transistor M3, the circuit of the memory cell array 1470 can be formed using only n-channel transistors.

Figure 13H:
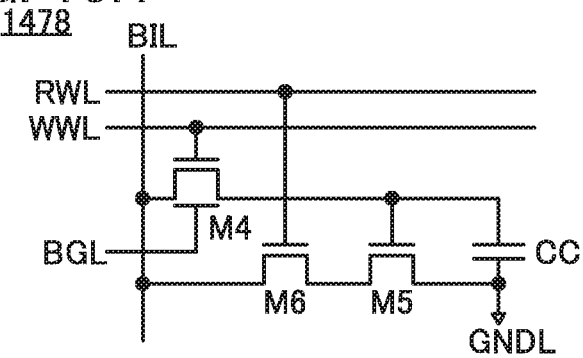

FIG. 13(H) illustrates an example of a gain-cell memory cell including three transistors and one capacitor. A memory cell 1478 illustrated in FIG. 13(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and the gate of the transistor M4 may be electrically connected to each other. Alternatively, the transistor M4 may not include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only re-channel transistors.

In the case where the semiconductor device described in the above embodiment is used for the memory cell 1478, the transistor described in the above embodiment can be used as the transistor M4. When an OS transistor is used as the transistor M4, the leakage current of the transistor M4 can be extremely low.

Note that the configurations of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 4

In this embodiment, an example of a chip 1200 on which a semiconductor device of the present invention is mounted will be described with reference to FIG. 14. A plurality of circuits (systems) are mounted on the chip 1200. The technic in which a plurality of circuits (systems) are integrated on one chip is referred to as system on chip (SoC) in some cases.

Figure 14A:
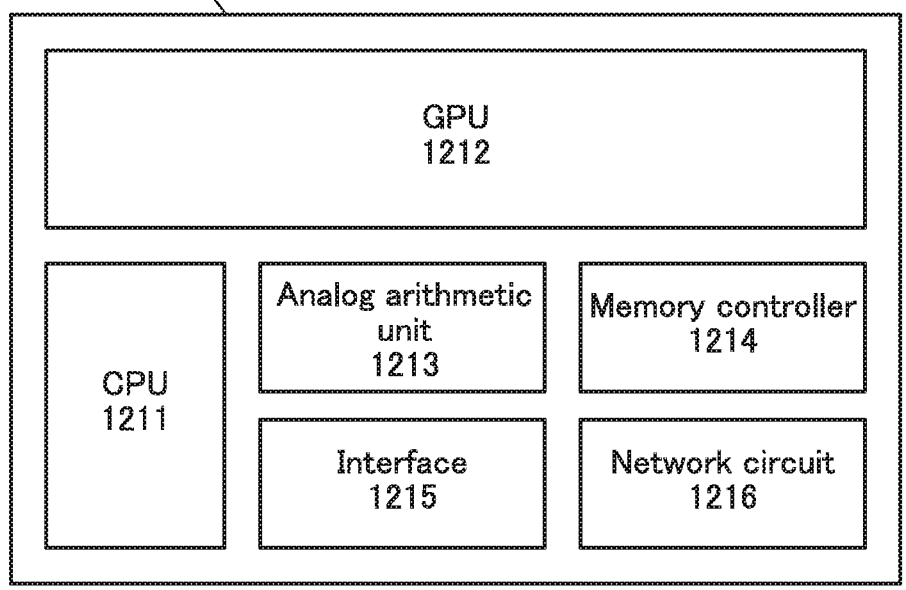
FIG. 14 (A), (B) Schematic views of a semiconductor device of one embodiment of the present invention.

As illustrated in FIG. 14(A), the chip 1200 includes a CPU (Central Processing Unit) 1211, a GPU (Graphics Processing Unit) 1212, one or a plurality of analog arithmetic units 1213, one or a plurality of memory controllers 1214, one or a plurality of interfaces 1215, one or a plurality of network circuits 1216, and the like.

Figure 14B:
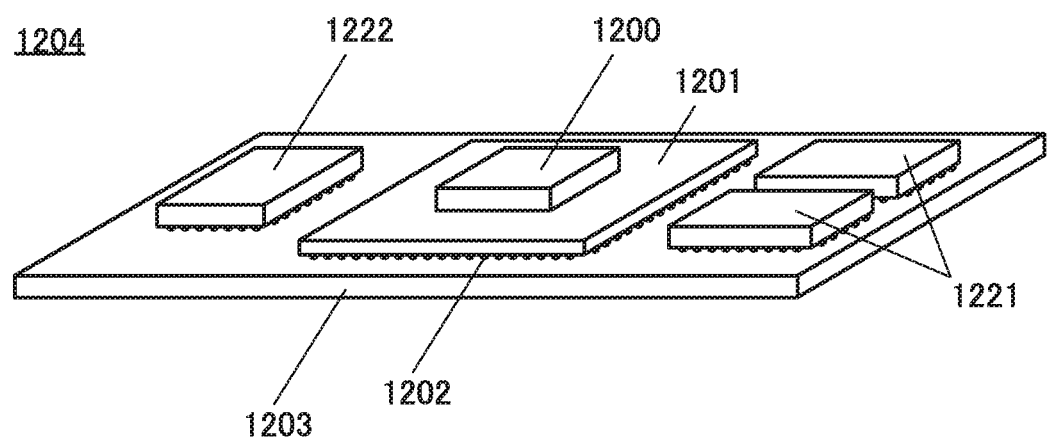

A bump (not illustrated) is provided on the chip 1200, and as illustrated in FIG. 14(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

Memory devices such as a DRAM 1221 and a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a large number of data and can be used for image processing and product-sum operation. When an image processing circuit and a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221, and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, a circuit for network security may be included.

The circuits (systems) can be formed in the chip 1200 in the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 using the SoC technology, and thus can have a small size. The GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, examples, and the like.

Embodiment 5

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for a variety of removable memory devices such as memory cards (e.g., SD cards), USB memories, and SSDs (solid state drives). FIG. 15 schematically illustrates some structure examples of removable memory devices. The semiconductor device described in the above embodiment is processed into a packaged memory chip and used in a variety of storage devices and removable memories, for example.

FIG. 15(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 15(B) is a schematic external view of an SD card, and FIG. 15(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on a rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 15(D) is a schematic external view of an SSD, and FIG. 15(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on a rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 6

The semiconductor device of one embodiment of the present invention can be used for a processor such as a CPU and a GPU or a chip. FIG. 16 illustrates specific examples of electronic devices each including a processor such as a CPU or a GPU or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or notebook personal computer, a monitor for a computer and the like, digital signage, and a large game console like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 16 illustrates examples of the electronic devices.

[Mobile Phone]

Figure 16A:
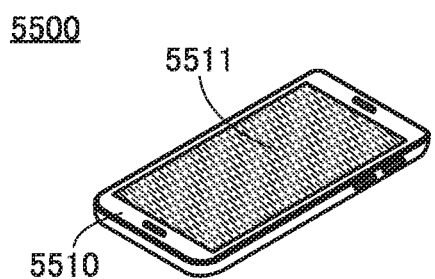
FIG. 16 (A), (B), (C), (D), (E1), (E2), (F) Views illustrating electronic devices of embodiments of the present invention.

FIG. 16(A) illustrates a mobile phone (smartphone) which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

Figure 16B:
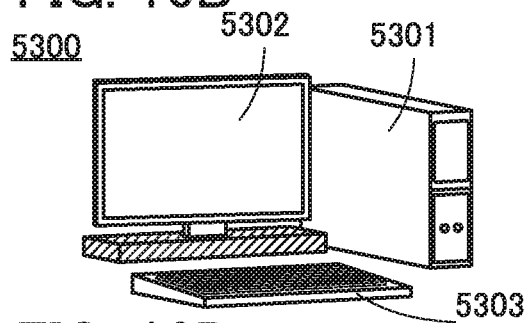

FIG. 16(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are respectively illustrated as examples of the electronic device in FIGS. 16(A) and 16(B); alternatively, an information terminal other than a smartphone and a desktop information terminal can be used. Examples of an information terminal other than a smartphone and a desktop information terminal include a PDA (Personal Digital Assistant), a notebook information terminal, and a workstation.

[Electrical Appliance]

Figure 16C:
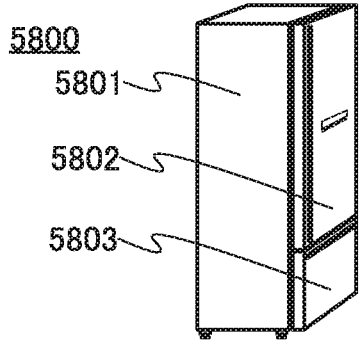

FIG. 16(C) illustrates an electric refrigerator-freezer 5800 as an example of an electrical appliance. The electric refrigerator-freezer 5800 includes a housing 5801, a refrigerator door 5802, a freezer door 5803, and the like.

When the chip of one embodiment of the present invention is used for the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described in this example as an electric appliance, examples of other electrical appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Console]

Figure 16D:
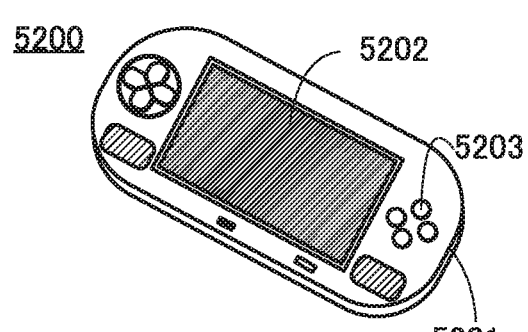
Figure 16D:
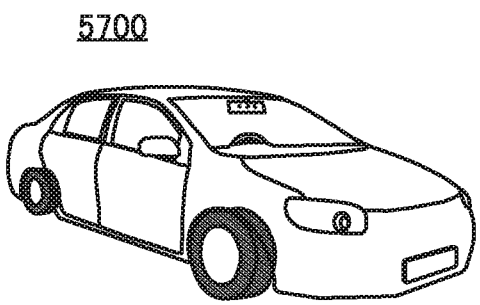
Figure 16D:
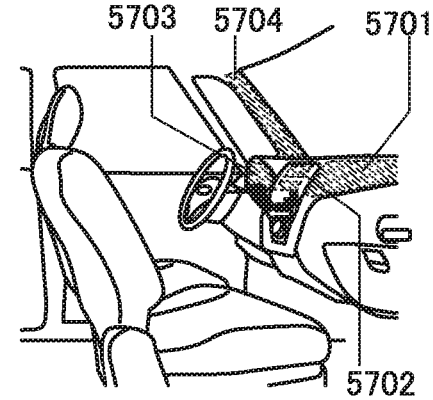

FIG. 16(D) illustrates a portable game console 5200 as an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

In general, the progress of a game, the actions and words of game characters, and expressions of a phenomenon or the like that occurs in the game are determined by a program of the game; however, the use of artificial intelligence in the portable game console 5200 enables expressions not limited by the program of the game. For example, questions posed by the player, the progress of the game, time, and actions and words of game characters can be changed for various expressions.

When a game requiring a plurality of players is played on the portable game console 5200, the artificial intelligence can create a virtual game player; thus, the game can be played alone with the game player created by the artificial intelligence as an opponent.

Although the portable game console is illustrated in FIG. 16(D) as an example of a game console, the game console using the GPU or the chip of one embodiment of the present invention is not limited thereto. Examples of the game console using the GPU or the chip of one embodiment of the present invention include a home stationary game console, an arcade game console installed in entertainment facilities (a game center, an amusement park, and the like), a throwing machine for batting practice installed in sports facilities, and the like.

[Moving Vehicle]

The GPU or the chip of one embodiment of the present invention can be used for an automobile, which is a moving vehicle, and the periphery of a driver's seat in the automobile.

FIG. 16(E1) illustrates an automobile 5700 as an example of a moving vehicle, and FIG. 16(E2) illustrates the periphery of a windshield inside the automobile. FIG. 16(E2) illustrates a display panel 5701, a display panel 5702, and a display panel 5703 that are attached to a dashboard, and a display panel 5704 that is attached to a pillar.

The display panel 5701 to the display panel 5703 can provide a variety of kinds of information by displaying a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 leads to compensation for the blind areas and improve safety. In addition, display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. The display panel 5701 to the display panel 5704 may display information regarding navigation, risk prediction, and the like.

Although an automobile is described above as an example of a moving vehicle, the moving vehicles are not limited to an automobile. Examples of the moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used for a broadcasting system.

Figure 16F:
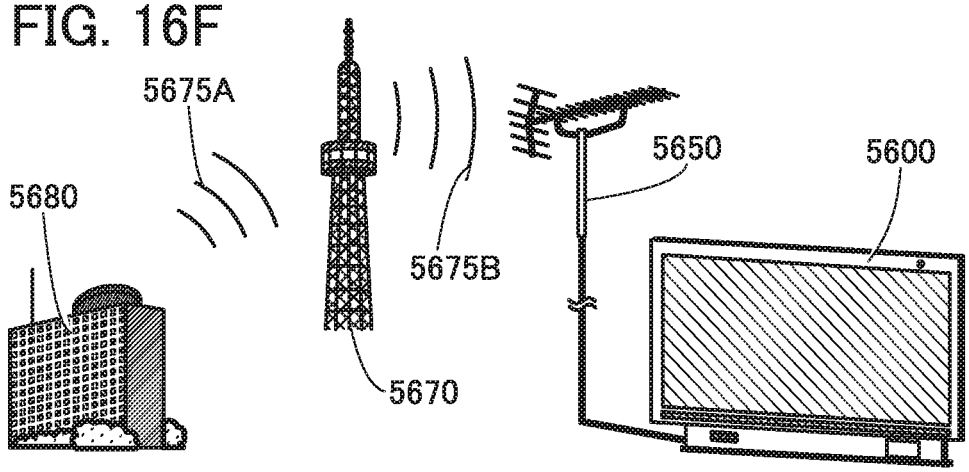

FIG. 16(F) schematically illustrates data transmission in a broadcasting system. Specifically, FIG. 16(F) illustrates a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 16(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 16(F) and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, the broadcast data is decompressed by a decoder of the receiving device included in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device with artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of the artificial intelligence, their effects, and the like described in this embodiment can be combined as appropriate with the description of another electronic device.

This embodiment can be implemented in an appropriate combination with the structures described in the other embodiments, examples, and the like.

REFERENCE NUMERALS

200: transistor, 200A: transistor, 200B: transistor, 200C: transistor, 200D: transistor, 200E: transistor, 203: conductor, 205: conductor, 210: insulator, 212: insulator, 214: insulator, 216: insulator, 220: insulator, 222: insulator, 224: insulator, 230: semiconductor layer, 230a: semiconductor layer, 230b: semiconductor layer, 230c: semiconductor layer, 231: region, 231d: region, 231s: region, 240: conductor, 240d: conductor, 240s: conductor, 241: opening, 241d: opening, 241s: opening, 244: conductor, 244A: conductive film, 244bg: conductor, 244d: conductor, 244s: conductor, 244tg: conductor, 246: conductor, 246A: conductive film, 246bg: conductor, 246d: conductor, 246s: conductor, 246tg: conductor, 250: insulator, 260: conductor, 260a: conductor, 260b: conductor, 270: insulator, 271: insulator, 274: insulator, 275: insulator, 276: insulator, 276A: insulating film, 276bg: insulator, 276d: insulator, 276s: insulator, 276tg: insulator, 280: insulator, 282: insulator, 284: insulator.

The invention claimed is:

1. A semiconductor device comprising:
an oxide semiconductor layer;
a first insulator over the oxide semiconductor layer, the first insulator including an opening;
a first conductor over the oxide semiconductor layer; and
a second conductor and a second insulator over the first conductor,
wherein the first conductor, the second conductor, and the second insulator are positioned in the opening,
wherein the first conductor is a conductive metal oxide,
wherein the first conductor is in contact with a top surface of the oxide semiconductor layer at a bottom of the opening,
wherein the second insulator is in contact with a top surface of the first conductor and a side surface of the first insulator,
wherein the second conductor is in contact with the top surface of the first conductor and a side surface of the second insulator,
wherein the second insulator includes an oxide or a nitride,
wherein the oxide includes one kind or more kinds selected from hafnium, aluminum, boron, gallium, zinc, yttrium, zirconium, tungsten, titanium, tantalum, nickel, germanium, and magnesium, and
wherein the nitride includes aluminum or silicon.

2. The semiconductor device according to claim 1,
wherein the oxide semiconductor layer includes In, an element M, and Zn, and
wherein the element M is Al, Ga, Y, or Sn.

3. The semiconductor device according to claim 1, wherein the second insulator is positioned between the first insulator and the second conductor in the opening.

4. The semiconductor device according to claim 1, wherein the first conductor includes indium tin oxide, indium tin oxide containing silicon, zinc oxide, indium tin oxide containing zinc, zinc oxide containing gallium, zinc oxide containing aluminum, tin oxide, tin oxide containing fluorine, tin oxide containing aluminum, or ruthenium oxide.

5. The semiconductor device according to claim 1, wherein the second conductor includes tungsten or polysilicon.

6. The semiconductor device according to claim 1,
wherein the first insulator contains excess oxygen and the second insulator has a barrier property against oxygen.

7. The semiconductor device according to claim 1, wherein the first conductor and the second conductor function as a wiring.

8. A semiconductor device comprising:
a third conductor;
a first insulator over the third conductor, the first insulator including an opening;

a first conductor over the third conductor; and
a second conductor and a second insulator over the first conductor,
wherein the first conductor, the second conductor, and the second insulator are positioned in the opening,
wherein the first conductor is in contact with a top surface of the third conductor at a bottom of the opening,
wherein the first conductor is a conductive metal oxide,
wherein the second insulator is in contact with a top surface of the first conductor and a side surface of the first insulator,
wherein the second conductor is in contact with the top surface of the first conductor and a side surface of the second insulator,
wherein the second insulator includes an oxide or a nitride,
wherein the oxide includes one kind or more kinds selected from hafnium, aluminum, boron, gallium, zinc, yttrium, zirconium, tungsten, titanium, tantalum, nickel, germanium, and magnesium, and
wherein the nitride includes aluminum or silicon.

9. The semiconductor device according to claim 8, wherein the first conductor includes indium tin oxide, indium tin oxide containing silicon, zinc oxide, indium tin oxide containing zinc, zinc oxide containing gallium, zinc oxide containing aluminum, tin oxide, tin oxide containing fluorine, tin oxide containing aluminum, or ruthenium oxide.

10. The semiconductor device according to claim 8, wherein the second conductor includes tungsten or polysilicon.

11. The semiconductor device according to claim 8, wherein the first insulator contains excess oxygen and the second insulator has a barrier property against oxygen.

12. The semiconductor device according to claim 8, wherein the first conductor and the second conductor function as a wiring.

13. The semiconductor device according to claim 8, wherein the second insulator is positioned between the first insulator and the second conductor in the opening.

* * * * *